US012765059B2

(12) United States Patent
Lai et al.

(10) Patent No.: US 12,765,059 B2
(45) Date of Patent: Oct. 13, 2026

(54) DISPLAY PANEL AND DISPLAY DEVICE

(71) Applicant: Xiamen Tianma Display Technology Co., Ltd., Xiamen (CN)

(72) Inventors: Qingjun Lai, Xiamen (CN); Jinjin Yang, Xiamen (CN); Yihua Zhu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 845 days.

(21) Appl. No.: 18/089,341

(22) Filed: Dec. 27, 2022

(65) Prior Publication Data

US 2023/0134599 A1 May 4, 2023

(30) Foreign Application Priority Data

Aug. 18, 2022 (CN) ......................... 202210993505.7

(51) Int. Cl.
*H10D 86/40* (2025.01)
*H10D 86/60* (2025.01)

(52) U.S. Cl.
CPC ........... *H10D 86/60* (2025.01); *H10D 86/441* (2025.01)

(58) Field of Classification Search
CPC ............................. H10D 86/60; H10D 86/441
See application file for complete search history.

(56) References Cited

U.S. PATENT DOCUMENTS

| | | | | |
|---|---|---|---|---|
| 9,293,102 B1* | 3/2016 | Chiu | G09G 3/3648 | |
| 2009/0102758 A1* | 4/2009 | Anzai | G09G 3/2096 | 345/76 |
| 2019/0237487 A1* | 8/2019 | Zhang | G02F 1/1345 | |
| 2019/0278145 A1* | 9/2019 | Tanaka | G02F 1/136286 | |
| 2020/0273928 A1* | 8/2020 | Che | H10K 59/123 | |
| 2020/0365077 A1* | 11/2020 | Park | G09G 3/3225 | |
| 2020/0381505 A1* | 12/2020 | Cho | H10K 59/1216 | |
| 2021/0013287 A1* | 1/2021 | Bang | G06F 1/1652 | |
| 2021/0074783 A1* | 3/2021 | Kang | H10D 86/60 | |
| 2023/0043145 A1* | 2/2023 | Yuan | G09G 3/3258 | |
| 2023/0110850 A1* | 4/2023 | Wang | H10K 59/131 | 257/72 |
| 2023/0180549 A1* | 6/2023 | Li | H10K 59/131 | 257/40 |

FOREIGN PATENT DOCUMENTS

| | | | |
|---|---|---|---|
| KR | 20190069061 A * | 6/2019 | G06F 3/04164 |
| KR | 20210148547 A * | 12/2021 | H10D 86/481 |

* cited by examiner

*Primary Examiner* — Fatima N Farokhrooz
(74) *Attorney, Agent, or Firm* — KDW FIRM PLLC

(57) ABSTRACT

Provided are a display panel and a display device. The display panel includes a display region and a non-display region. The display panel further includes multiple data lines, multiple connection wires and multiple signal wires. The multiple connection wires are electrically connected to the multiple data lines and the multiple signal wires respectively, the multiple data lines and the multiple connection wires are located in the display region, and the multiple signal wires are located in the non-display region. The multiple connection wires include a first connection wire group and a second connection wire group. The first connection wire group includes multiple first connection wires, the second connection wire group includes multiple second connection wires, the first connection wire group and the second connection wire group are located on two sides of a first central axis of the display panel respectively.

16 Claims, 17 Drawing Sheets

DISPLAY PANEL AND DISPLAY DEVICE

CROSS-REFERENCE TO RELATED APPLICATION(S)

This application claims priority to Chinese Patent Application No. 202210993505.7 filed Aug. 18, 2022, the disclosure of which is incorporated herein by reference in its entirety.

TECHNICAL FIELD

Embodiments of the present disclosure relate to the field of display technologies and, in particular, to a display panel and a display device.

BACKGROUND

In recent years, to increase the resolution and the screen-to-body ratio of the display panel, wires in the display panel are disposed more and more densely, leading to the inevitable coupling effect between the wires. As a result, crosstalk of images displayed by the display panel is generated, and thus the display effect of the display panel is affected.

SUMMARY

Embodiments of the present disclosure provide a display panel and a display device. A first connection wire group and a second connection wire group which are located on two sides of a first central axis respectively are disposed asymmetrically, so that crosstalk generated by connection wires on other wires in the display panel can be reduced or balanced, and the display effect of the display panel is improved.

In a first aspect, the embodiments of the present disclosure provide a display panel. The display panel includes a display region and a non-display region, and the non-display region is located at least on a side of the display region.

The display panel further includes multiple data lines, multiple connection wires and multiple signal wires. The multiple connection wires are electrically connected to the multiple data lines and the multiple signal wires respectively, the multiple data lines and the multiple connection wires are located in the display region, and the multiple signal wires are located in the non-display region.

The multiple connection wires include a first connection wire group and a second connection wire group. The first connection wire group includes multiple first connection wires, the second connection wire group includes multiple second connection wires, the first connection wire group and the second connection wire group are located on two sides of a first central axis of the display panel respectively, and the extension direction of the first central axis is parallel to the extension direction of the multiple data lines.

The first connection wire group and the second connection wire group are disposed asymmetrically.

In a second aspect, the embodiments of the present disclosure provide a display device. The display device includes the display panel described in any one of the first aspect.

BRIEF DESCRIPTION OF DRAWINGS

In order to illustrate technical solutions in example embodiments of the present disclosure more clearly, a brief introduction to drawings required in the description of the embodiments will be given below. Apparently, the introduced drawings are merely part, not all, of drawings of the embodiments of the present disclosure to be described, and those of ordinary skill in the art may obtain other drawings based on the drawings described below on the premise that no creative work is done.

DETAILED DESCRIPTION

Figure 1:
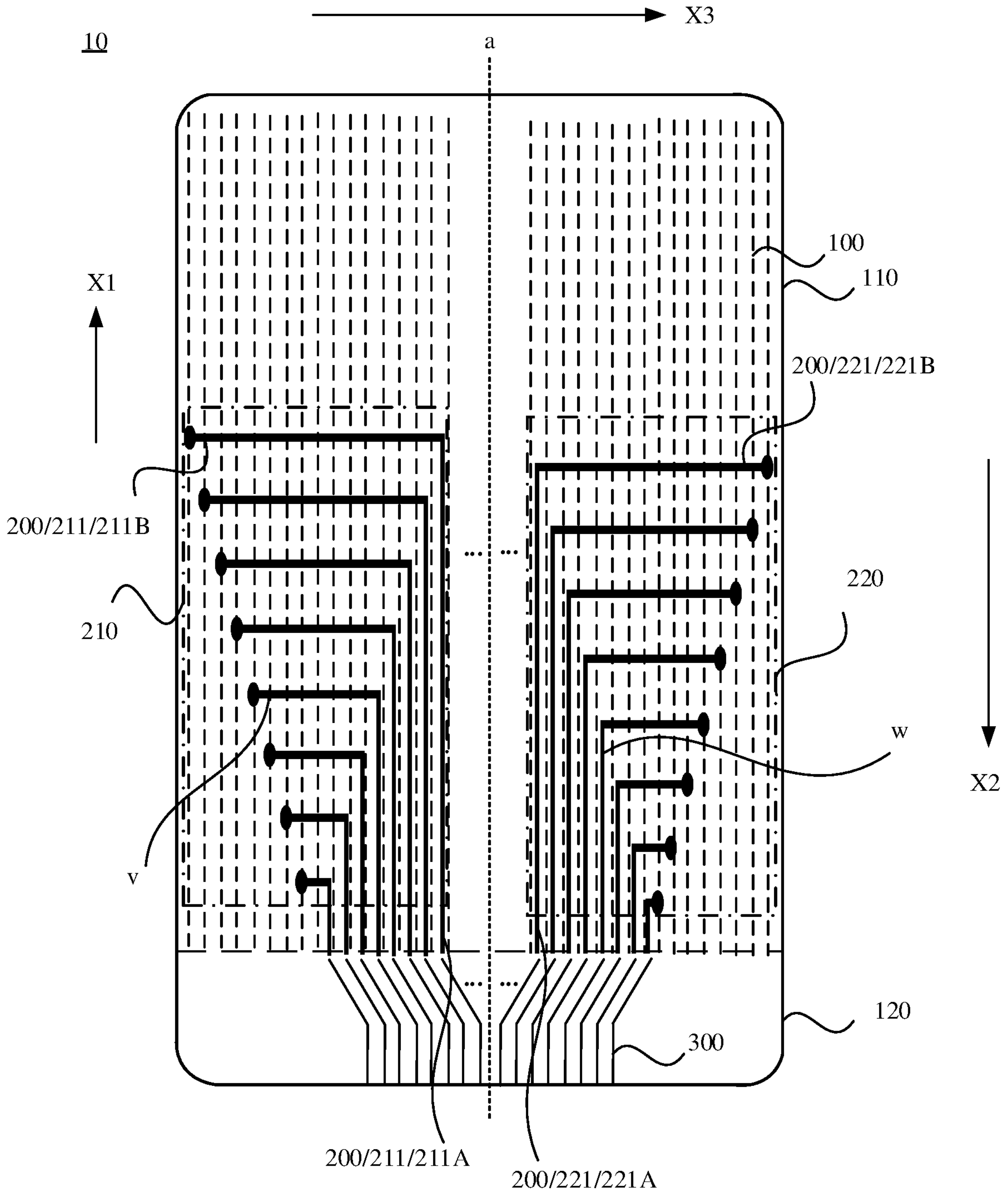
FIG. 1 is a diagram illustrating the structure of a display panel according to an embodiment of the present disclosure.

Hereinafter the present disclosure is further described in detail in conjunction with the drawings and embodiments. It is to be understood that the specific embodiments set forth below are merely intended to illustrate but not to limit the present disclosure. Additionally, it is to be noted that, for ease of description, only part, not all, of structures related to the present disclosure are illustrated in the drawings.

Figure 2:
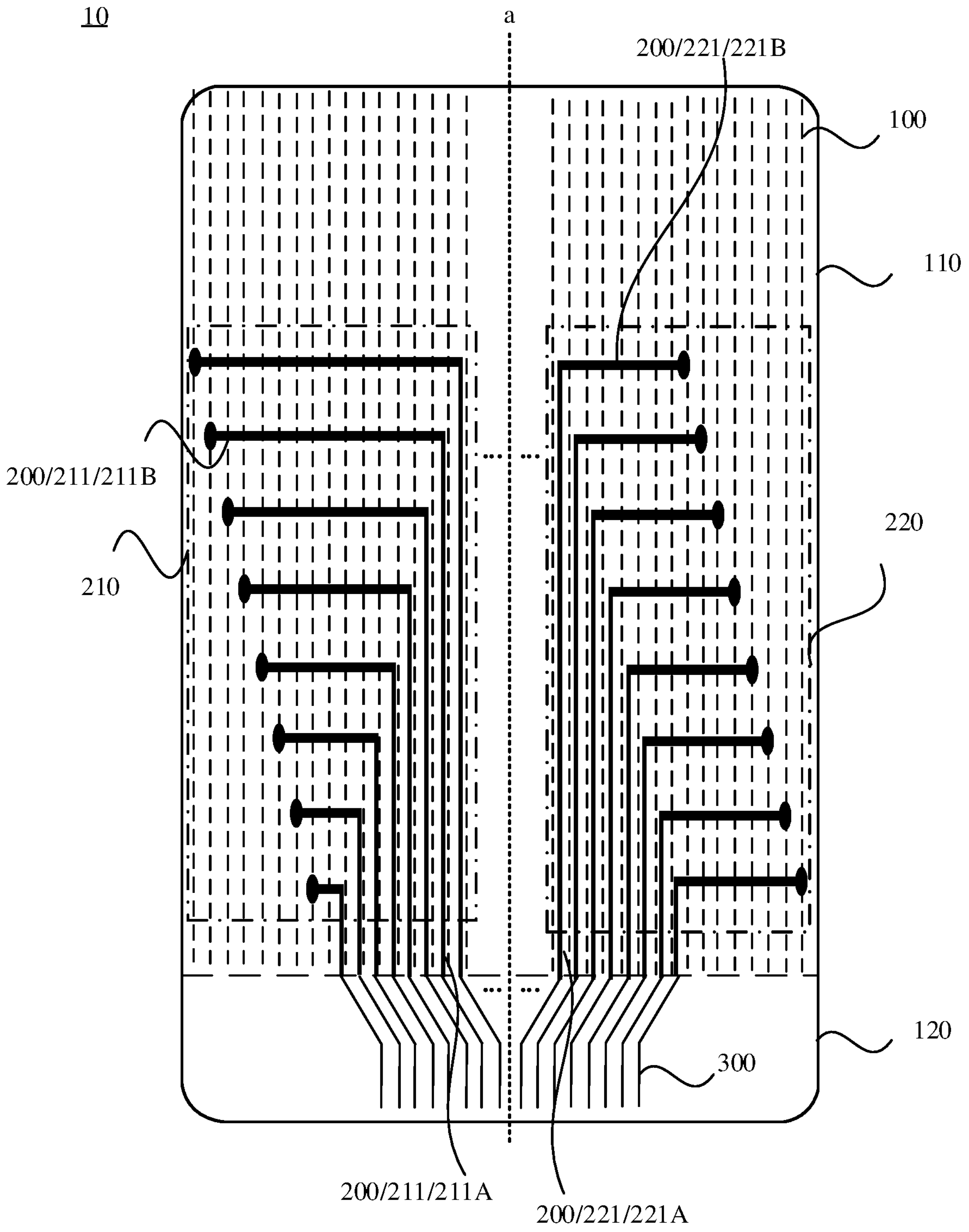
FIG. 2 is a diagram illustrating the structure of another display panel according to an embodiment of the present disclosure.

FIG. 1 is a diagram illustrating the structure of a display panel according to an embodiment of the present disclosure, and FIG. 2 is a diagram illustrating the structure of another display panel according to an embodiment of the present disclosure. Referring to FIG. 1 and FIG. 2, a display panel 10 provided in an embodiment of the present disclosure includes a display region 110 and a non-display region 120. The non-display region 120 is located at least on a side of the display region 110. The display panel 10 further includes multiple data lines 110, multiple connection wires 200 and multiple signal wires 300. The multiple connection wires 200 are electrically connected to the multiple data lines 100 and the multiple signal wires 300 respectively, the multiple data lines 100 and the multiple connection wires 200 are located in the display region 110, and the multiple signal wires 300 are located in the non-display region 120. The multiple connection wires 200 include a first connection wire group 210 and a second connection wire group 220, where the first connection wire group 210 includes multiple first connection wires 211, and the second connection wire group 220 includes multiple second connection wires 221; the first connection wire group 210 and the second connection wire group 220 are located on two sides of a first central axis a of the display panel 10 respectively, and the extension direction of the first central axis a is parallel to the extension direction of the multiple data lines 100. The first connection wire group 210 and the second connection wire group 220 are disposed asymmetrically.

In an embodiment, the display panel 10 includes the display region 110 and the non-display region 120. The display region 110 includes subpixels (not shown in the figures) and display signal lines, such as the data lines 100, connected to the subpixels for implementing the display function of the display panel 100. The non-display region 120 includes a display controller, such as a drive chip (not specifically shown in the figures), connected to the display signal lines, and provides display signals for the display signal lines through the display controller so as to drive the display panel 10 to achieve the display function. Referring to FIG. 1 and FIG. 2, the non-display region 120 may be a lower bezel region located on a side of the display region 110. The position relationship between the display region 110 and the non-display region 120 is not specifically limited in the embodiment of the present disclosure.

Further, referring to FIG. 1 and FIG. 2, the display panel 100 includes multiple data lines 100, multiple connection wires 200 and multiple signal wires 300. The electrical connection between the data lines 100 and the signal wires 300 is achieved through the connection wires 200, so that the normal transmission of data signals is ensured. The signal wires 300 are disposed in the non-display region 120, and the data lines 100 are disposed in the display region 110. Unlike the solution of disposing the connection wires 200 in the non-display region in the related art, to reduce the area of the non-display region 120 of the display panel 10, that is, to improve the proportion of the display region 110 to the display panel 10, the connection wires 200 are disposed in the display region 110 in the embodiment of the present disclosure, so as to effectively ensure the narrow bezel effect of the display panel 10.

In an embodiment, the connection wires 200 include the first connection wire group 210 and the second connection wire group 220, and the first connection wire group 210 and the second connection wire group 220 are located on two sides of the first central axis a of the display panel 10 respectively, so as to achieve the normal transmission of data signals of two sides of the display region 110 of the display panel 10, and ensure the normal display of the display panel 10. Further, the first connection wire group 210 includes multiple first connection wires 211, and the second connection wire group 220 includes multiple second connection wires 221. Referring to FIG. 1 and FIG. 2, only part of the first connection wires 211 and second connection wires 221 are illustrated as an example in the figures, and the number of first connection wires 211 and the number of second connection wires 221 are not specifically limited in the embodiment of the present disclosure. Since the first connection wire group 210 and the second connection wire group 220 are disposed in the display region 110 of the display panel 10, the connection wires 200 may be coupled with other wires (not specifically shown in the figures), for example, power supply signal lines, in the display panel 10, that is, crosstalk between wires may be generated, affecting the display effect of the display panel 10. In the embodiment of the present disclosure, the first connection wire group 210 and the second connection wire group 220 are disposed asymmetrically, that is, the positions for disposing the first connection wire group 210 and the second connection wire group 220 are adjusted, so as to reduce or balance crosstalk generated between the connection wires 200 and other signal lines in the display panel, and ensure the display effect of the display panel 10.

In an embodiment, in the region for disposing the first connection wire group 210 in the display panel, crosstalk is more or less generated between the connection wires 200 and other signal lines in the region; if the position for disposing the second connection wire group 220 and the position for disposing the first connection wire group 210 are disposed symmetrically only for simplicity of the preparation process, the crosstalk generated between the connection wires 200 and other signal lines in this region will be amplified, which is not conducive to the smooth and balanced display of the display panel 10. In the embodiment of the present disclosure, the first connection wire group 210 and the second connection wire group 220 are disposed asymmetrically about the first central axis a, so that coupling and crosstalk between the connection wires 200 and other signal lines in the region for disposing the connection wires 200 of the display panel 10 can be reduced or balanced, the stability of signal transmission in the display panel 10 can be improved, and the display balance of the display panel 10 can be improved, that is, the display effect of the display panel 10 can be improved.

In summary, for the display panel provided in the embodiment of the present disclosure, the connection wires include the first connection wire group and the second connection wire group located on two sides of the first central axis, the first connection wire group includes multiple first connection wires, and the second connection wire group includes multiple second connection wires; for the manner of disposing the connection wires, the first connection wire group and the second connection wire group are disposed asymmetrically about the first central axis, so that crosstalk generated between the connection wires and other wires in the display panel can be reduced or balanced, the display balance of the display panel is ensured, and thus the display effect of the display panel is improved.

Figure 3:
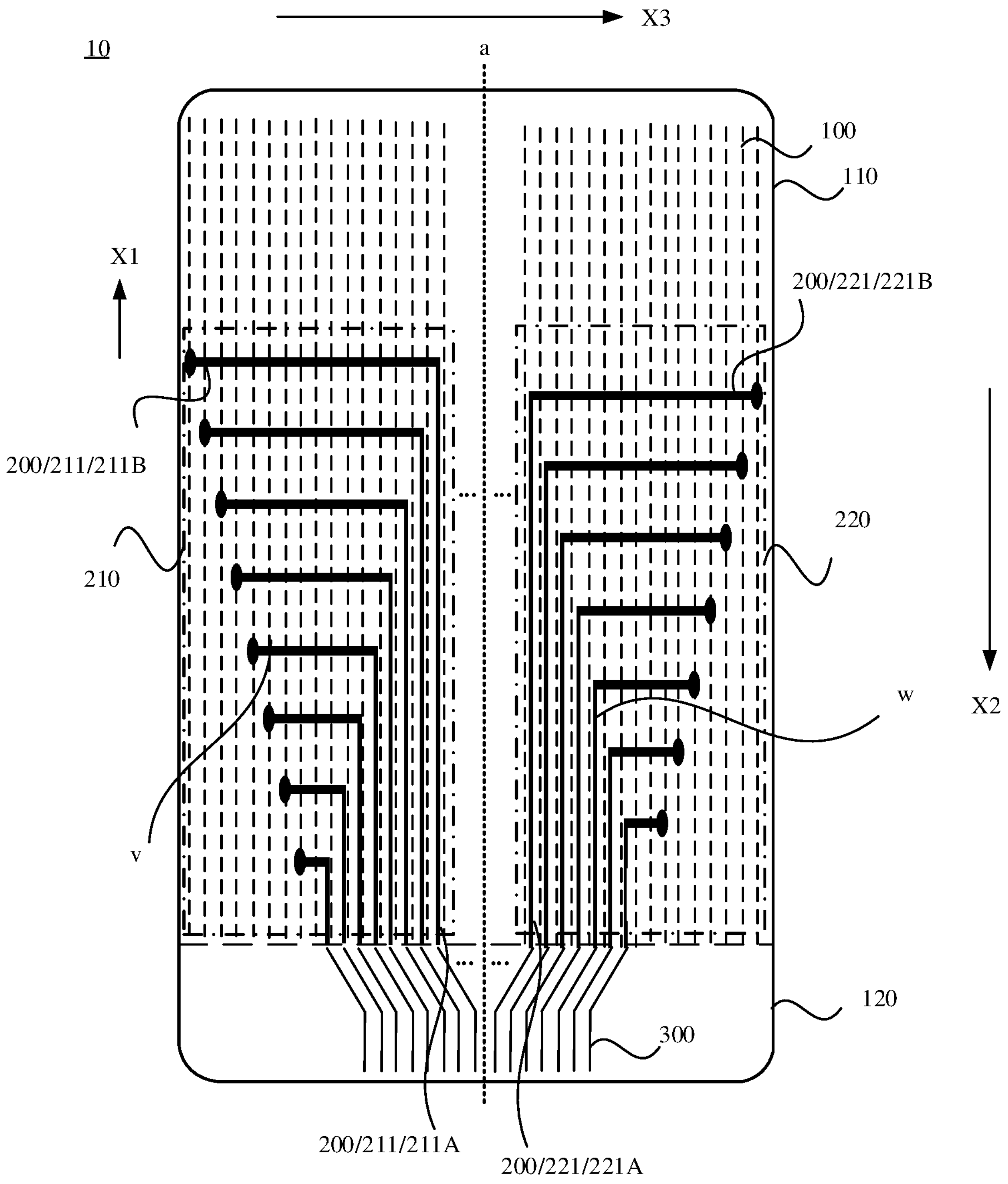
FIG. 3 is a diagram illustrating the structure of another display panel according to an embodiment of the present disclosure.

FIG. 3 is a diagram illustrating the structure of another display panel according to an embodiment of the present disclosure. Referring to FIG. 1 and FIG. 3, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The extension direction of the third wire section 221A is parallel to the extension direction of the first wire section 211A, and the extension direction of the fourth wire section 221B is parallel to the extension direction of the second wire section 211B. The first connection wire group 210 includes V first connection wires 211, and the second connection wire group 220 includes W second connection wires 221, where a straight line where a first wire section 211A of a v-th first connection wire 211 is located and a straight line where a third wire section 221A of a w-th second connection wire 221 is located are symmetrical about the first central axis a. Along the extension direction X1 of the data lines, a second wire section 211B of the v-th first connection wire 211 and a fourth wire section 221B of the w-th second connection wire 221 are disposed in a staggered manner, where V, W, v and w are each a positive integer, $1 \le v \le V$, and $1 \le w \le W$.

In an embodiment, referring to FIG. 1 and FIG. 3, a first connection wire 211 includes a first wire section 211A and a second wire section 211B, and a second connection wire 221 includes a third wire section 221A and a fourth wire section 221B. Wire sections which are connected to each other and whose extension directions intersect are disposed, so that electrical connection in the display panel between the data lines 100 in the display region 110 and the signal wires 300 in the non-display region 120 is achieved through the connection wires 200, various arrangements of the connection wires 200 are achieved through the adjustment on different wire sections, and the flexibility and diversity of the arrangements of the connection wires 200 are promoted.

Further, the first connection wire group 210 includes V first connection wires 211, and the second connection wire group 220 includes W second connection wires 221. The value of V and the value of W are not specifically limited in the embodiment of the present disclosure. Referring to FIG. 1 and FIG. 3, the v-th first connection wire 211 in the first connection wire group 210 is shown as v in the figures, and the w-th second connection wire 221 in the second connection wire group 220 is shown as w in the figures. When the straight line where the first wire section 211A of the v-th first connection wire 211 is located and the straight line where the third wire section 221A of the w-th second connection wire 221 is located are symmetrical about the first central axis a, and V=W and v=w, referring to FIG. 1, the second wire section 211B of the v-th first connection wire 211 and the fourth wire section 221B of the w-th second connection wire 221 are disposed in a staggered manner along the extension direction X1 of the data lines 100, so that the asymmetrical arrangement of the first connection wire 211 and the second connection wire 221 is achieved. When V is not equal to W, the V first connection wires 211 and the W second connection wires 221 in the figures must be disposed asymmetrically. Further, the second wire section 211B of the v-th first connection wire 211 and the fourth wire section 221B of the w-th second connection wire 221 are disposed asymmetrically along the extension direction X1 of the data lines 100. In the figures, an example is illustrated where the second wire section 211B of the v-th first connection wire 211 is located on a side of the fourth wire section 221B of the w-th second connection wire 211 away from the non-display region 120.

Further, referring to FIG. 1 and FIG. 3, when the first wire section 211A of the first connection wire 211 and the third wire section 221A of the second connection wire 221 are asymmetrical about the first central axial a, the first connection wire 211 and the second connection wire 221 must be disposed asymmetrically. Further, referring to FIG. 2, when the first wire section 211A of the first connection wire 211 and the third wire section 221A of the second connection wire 221 are asymmetrical about the first central axial a, the extension length of the second wire section 211B and the extension length of the fourth wire section 221B may be adjusted to achieve the asymmetrical arrangement of the first connection wire 211 and the second connection wire 221. Further, referring to FIG. 1 and FIG. 3, when the first wire section 211A of the first connection wire 211 and the third wire section 221A of the second connection wire 221 are asymmetrical about the first central axial a, the position of a row where the second wire section 211B is located and the position of a row where the fourth wire section 221B is located may be adjusted to achieve the asymmetrical arrangement of the first connection wire 211 and the second connection wire 221. In other words, in the first connection wire group 210 and the second connection wire group 220, for two connection wires of which longitudinal (along the extension direction X1 of the data lines 100) wire sections are disposed symmetrically about the first central axis a, transverse (along the arrangement direction X3 of the data lines 100) wire sections corresponding to the two connection wires are not disposed in the same row. That is, a symmetrical and regular arrangement of the first connection wire group 210 and the second connection wire group 220 is broken, and thus the number of connection wires 200 and the number of other wires in the arrangement direction of the multiple data lines 100 are reduced. In this manner that the connection wires are not disposed in the same row, crosstalk generated by the same another wire on connection wires can further be reduced, for example, crosstalk generated on the same power supply signal line can be reduced, so that coupling fluctuation of signals between different wires is reversely reduced, the display balance of the display panel is ensured, and thereby the display effect of the display panel is improved.

In an embodiment, $|V-W| \ge 1$.

Referring to FIG. 3, the first connection wire group 210 includes V first connection wires 211, and the second connection wire group 220 includes W second connection wires 221, where $|V-W| \ge 1$. That is, the number of connection wires included in the first connection wire group 210 is different from the number of connection wires included in the second connection wire group 220. In this manner, the arrangement of connection wires in the first connection wire group and the arrangement of connection wires in the second connection wire group can be further differentiated, the symmetrical and regular arrangement of the first connection wire group 210 and the second connection wire group 220 is further broken, and thus the number of connection wires 200 and the number of other wires in the arrangement direction of the multiple data lines 100 are reduced. As a result, for example, crosstalk generated on the same power supply signal line is reduced, so that the display balance of the display panel is ensured, and the display effect of the display panel 10 is improved. It is to be noted that an example is illustrated in FIG. 3 where the first connection wire group 210 includes 8 first connection wires 211, and the second connection wire group 210 includes 7 second connection wires 221. In this case, V=8, and W=7. The number of connection wires in the first connection wire group 210 and the number of connection wires in the second connection wire group 220 are not specifically limited in the embodiment of the present disclosure.

Figure 4:
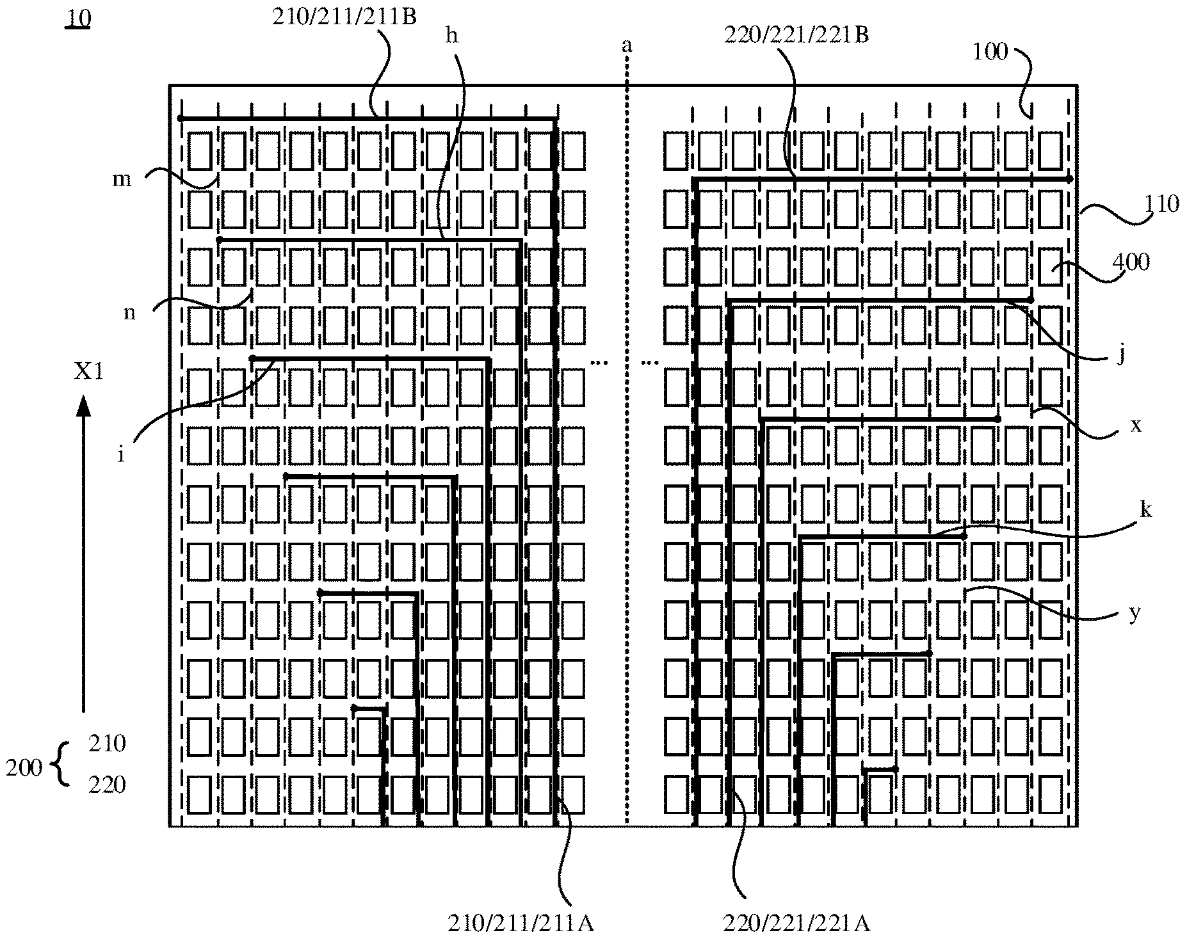
FIG. 4 is an enlarged diagram of a region for disposing connection wires in FIG. 1.
Figure 5:
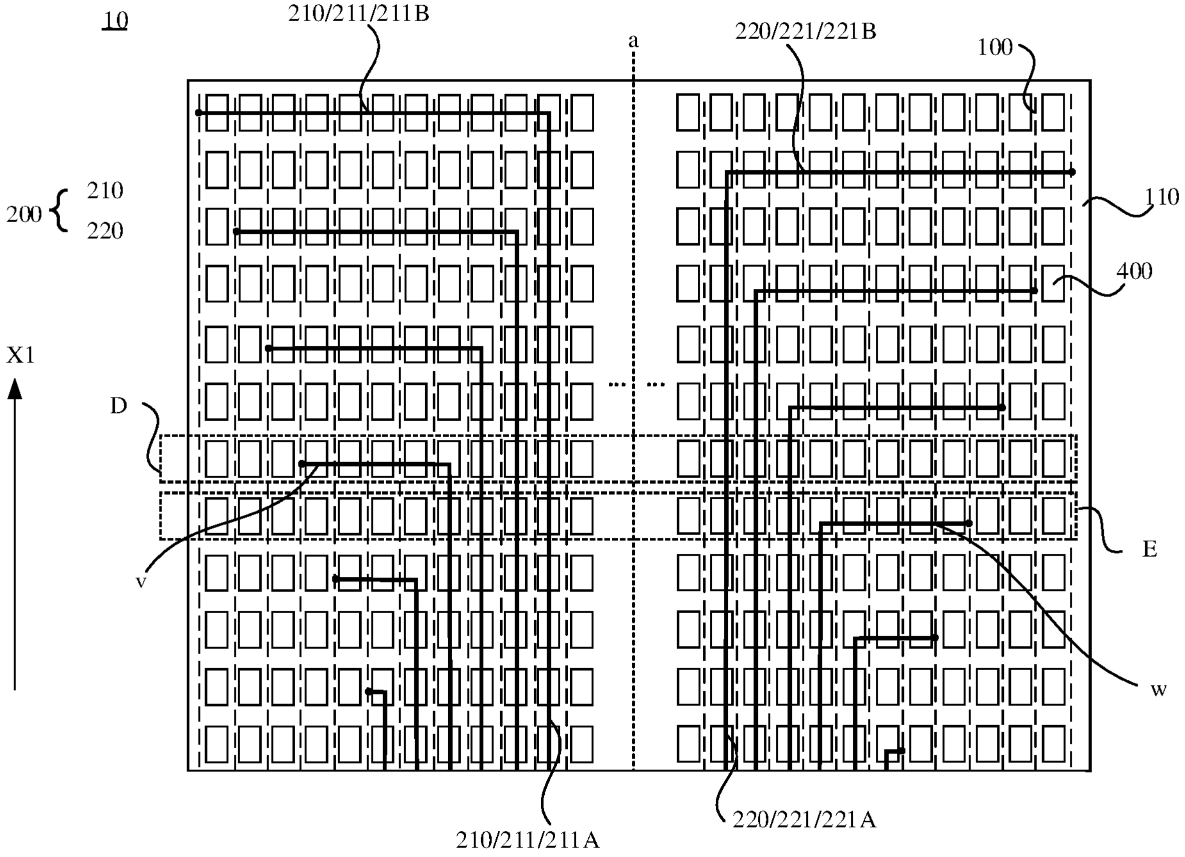
FIG. 5 is another enlarged diagram of the region for disposing the connection wires in FIG. 1.

FIG. 4 is an enlarged diagram of a region for disposing connection wires in FIG. 1, and FIG. 5 is another enlarged diagram of the region for disposing the connection wires in FIG. 1. Referring to FIG. 4 and FIG. 5, the display panel further includes multiple subpixels 400 located in the display region 110, where the multiple subpixels 400 are arranged in an array. At least a row of subpixels 400 are disposed between any adjacent two second wire sections 211B, and at least a row of subpixels 400 are disposed between any adjacent two fourth wire sections 221B. Along the extension direction X1 of the data lines 100, straight lines where at least part of second wire sections 211B are located are located between straight lines where adjacent two fourth wire sections 221B are located, and straight lines where at least part of fourth wire sections 221B are located are located between straight lines where adjacent two second wire sections 211B are located.

The display region 110 includes multiple array subpixels 400, and the subpixels 400 emit light by display signals provided by display signal lines to achieve the display function of the display panel 10. The subpixels 400 include red subpixels, green subpixels and blue subpixels, and the type and arrangement of the subpixels 400 are not specifically limited in the embodiment of the present disclosure.

Further, at least a row of subpixels 400 are disposed between any adjacent two second wire sections 211B, and at least a row of subpixels 400 are disposed between any adjacent two fourth wire sections 221B. Referring to FIG. 4, a second wire section 211B and a fourth wire section 221B may separately be located between adjacent two rows of subpixels 400. In this case, at least two rows of subpixels 400 may be disposed between adjacent two second wire sections 211B, and at least two rows of subpixels 400 may be disposed between adjacent two fourth wire sections 221B. FIG. 4 illustrates an example where two rows of subpixels 400 are disposed between adjacent two second wire sections 211B, and two rows of subpixels 400 are disposed between adjacent two fourth wire sections 221B. Referring to FIG. 5, a second wire section 211B overlaps subpixels 400 along the thickness direction (not shown in the figure) of the display panel 10, and a fourth wire section 221B overlaps subpixels 400 along the thickness direction (not shown in the figure) of the display panel 10. In this case, at least a row of subpixels 400 may be disposed between adjacent two second wire sections 211B, and at least a row of subpixels 400 may be disposed between adjacent two fourth wire sections 221B. FIG. 5 illustrates an example where a row of subpixels 400 are disposed between adjacent two second wire sections 211B, and a row of subpixels 400 are disposed between adjacent two fourth wire sections 221B. According to the preceding arrangement, in a case where the number of rows of subpixels 400 between adjacent two second wire sections 211B is ensured to be at least one row, it is convenient to achieve that along the extension direction X1 of the data lines 100, straight lines where at least part of second wire sections 211B are located are located between straight lines where adjacent two fourth wire sections 221B are located. Similarly, in a case where the number of rows of subpixels 400 between adjacent two fourth wire sections 221B is ensured to be at least one row, it is ensured that straight lines where at least part of second wire sections 211B are located are located between straight lines where adjacent two fourth wire sections 221B are located, that is, along the extension direction X1 of the data lines 100, second wire sections 211B and fourth wire sections 221B are alternately and cyclically arranged. In this manner, the symmetrical arrangement of the first connection wire group 210 and the second connection wire group 220 can be broken, and thus along the arrangement direction of the multiple data lines 100, crosstalk generated between the connection wires 200 and other wires is reduced, the display balance of the display panel is ensured, and the display effect of the display panel is improved.

With continued reference to FIG. 5, the display panel further includes multiple subpixels 400 located in the display region 110, where the multiple subpixels 400 are arranged in an array. Along the thickness direction (not shown in the figure) of the display panel 10, the second wire section 211B of the v-th first connection wire 211 (shown as v in the figure) overlaps a D-th row of subpixels (shown as D in the figure), and the fourth wire section 221B of the w-th second connection wire 221 (shown as w in the figure) overlaps an E-th row of subpixels 400 (shown as E in the figure), where $v=w$, and $D\neq E$.

In an embodiment, referring to FIG. 5, the v-th first connection wire 211 (shown as v in the figure) and the w-th second connection wire 221 are taken an example for illustration. The second wire section 211B of the first connection wire 211 overlaps the D-th row of subpixels 400 along the thickness direction of the display panel 10, and the fourth wire section 221B overlaps the E-th row of subpixels 400 along the thickness direction of the display panel 10, where $v=w$, and $D\neq E$. For example, that is, the row of subpixels 400 where the third first connection wire 211 in the first connection wire group 210 is located is different from the row of subpixels 400 where the third second connection wire 221 in the second connection wire group 220 is located, that is, the second wire section 211B of the first connection wire 211 and the fourth wire section 221B of the second connection wire 221 are disposed in a staggered manner. In this manner, along the arrangement direction of the multiple data lines 100, crosstalk generated between the connection wires 200 and other wires is reduced, and crosstalk is not generated on the same wire, that is, coupling fluctuation of data signals can also be reversely reduced, so that the display balance of the display panel is ensured, and thereby the display effect of the display panel is improved. Moreover, the first connection wires 211 and the second connection wires 221 disposed in the preceding manner makes the staggered arrangement simple.

Figure 6:
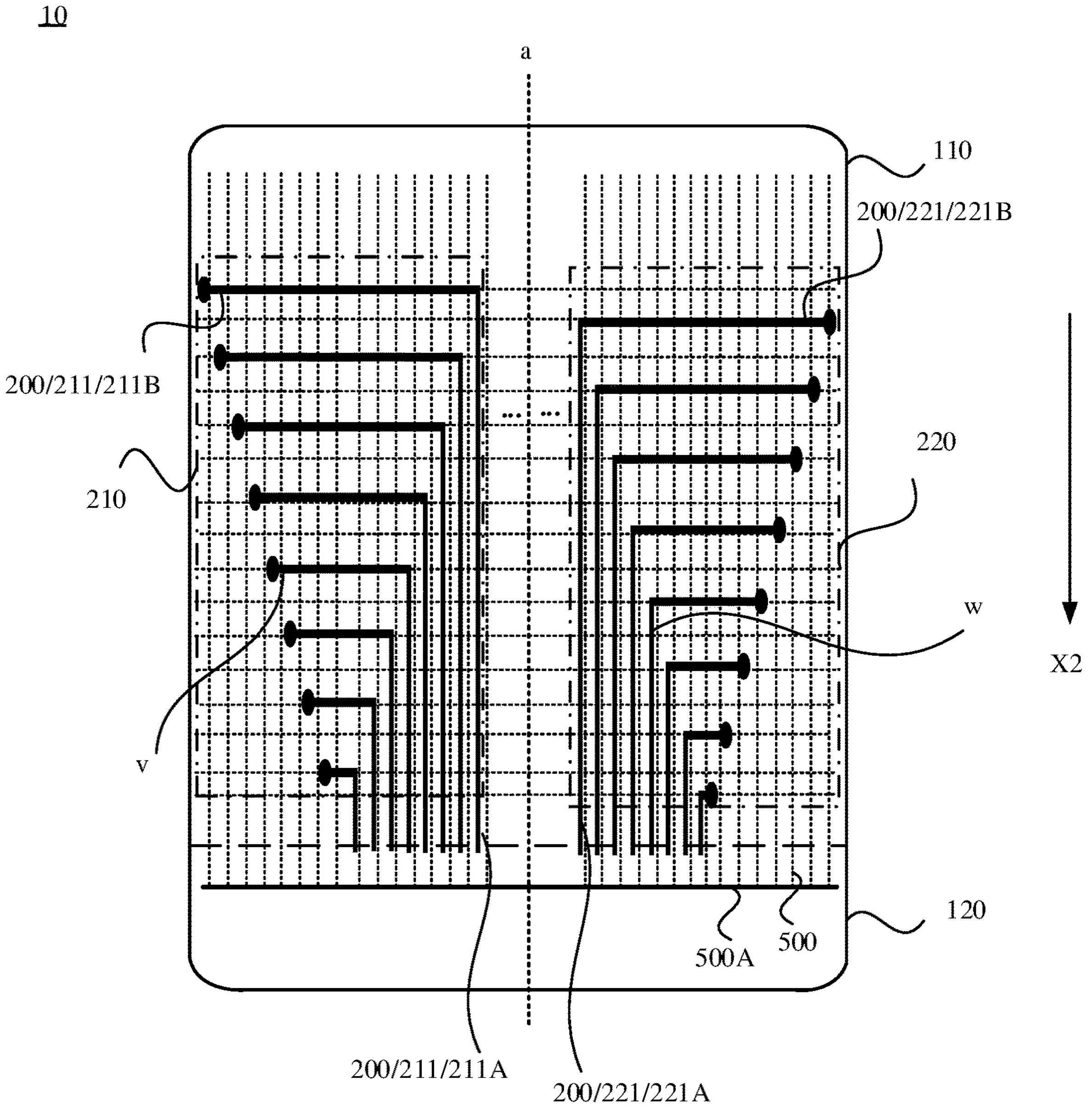
FIG. 6 is a diagram illustrating the structure of another display panel according to an embodiment of the present disclosure.

FIG. 6 is a diagram illustrating the structure of another display panel according to an embodiment of the present disclosure. As shown in FIG. 6, along the direction X2 from which the display region 110 points to the non-display region 120, extension lengths of second wire sections 211B gradually decrease, and extension lengths of fourth wire sections 221B gradually decrease.

In an embodiment, as shown in FIG. 6, the display panel 10 further includes a power supply signal bus 500A located in the non-display region 120 and power supply signal lines 500 connected to the power supply signal bus 500A. Power supply signals flow from the non-display region 120 to the display region 110. Since line resistance exists in the power supply signal lines 500, in the display region 110, power supply signals are relatively large in a region close to the non-display region 120, so that the coupling effect between connection wires 200 and power supply signal lines 500 in this region is stronger, and crosstalk caused to the power supply signals in the power supply signal lines 500 is greater. Therefore, to ensure the overall signal transmission effect of the display panel 10, that is, to reduce the overall crosstalk, the extension lengths of the second wire sections 211B of the first connection wires 211 are adjusted, while the extension lengths of the fourth wire sections 221B of the second connection wires 221 are also adjusted.

In an embodiment, along the direction X2 from which the display region 110 points to the non-display region 120, in a case where it is ensured that the first connection wire group 210 and the second connection wire group 220 are asymmetrical about the first central axis a, the extension lengths of the second wire sections 211B and the extension lengths of the fourth wire sections 221B gradually decrease, that is, extension lengths of positions where coupling crosstalk is likely to generate in the display panel 10 are reduced, so that the transmission stability and balance of signals in the wires in the display panel 10 are improved.

Figure 7:
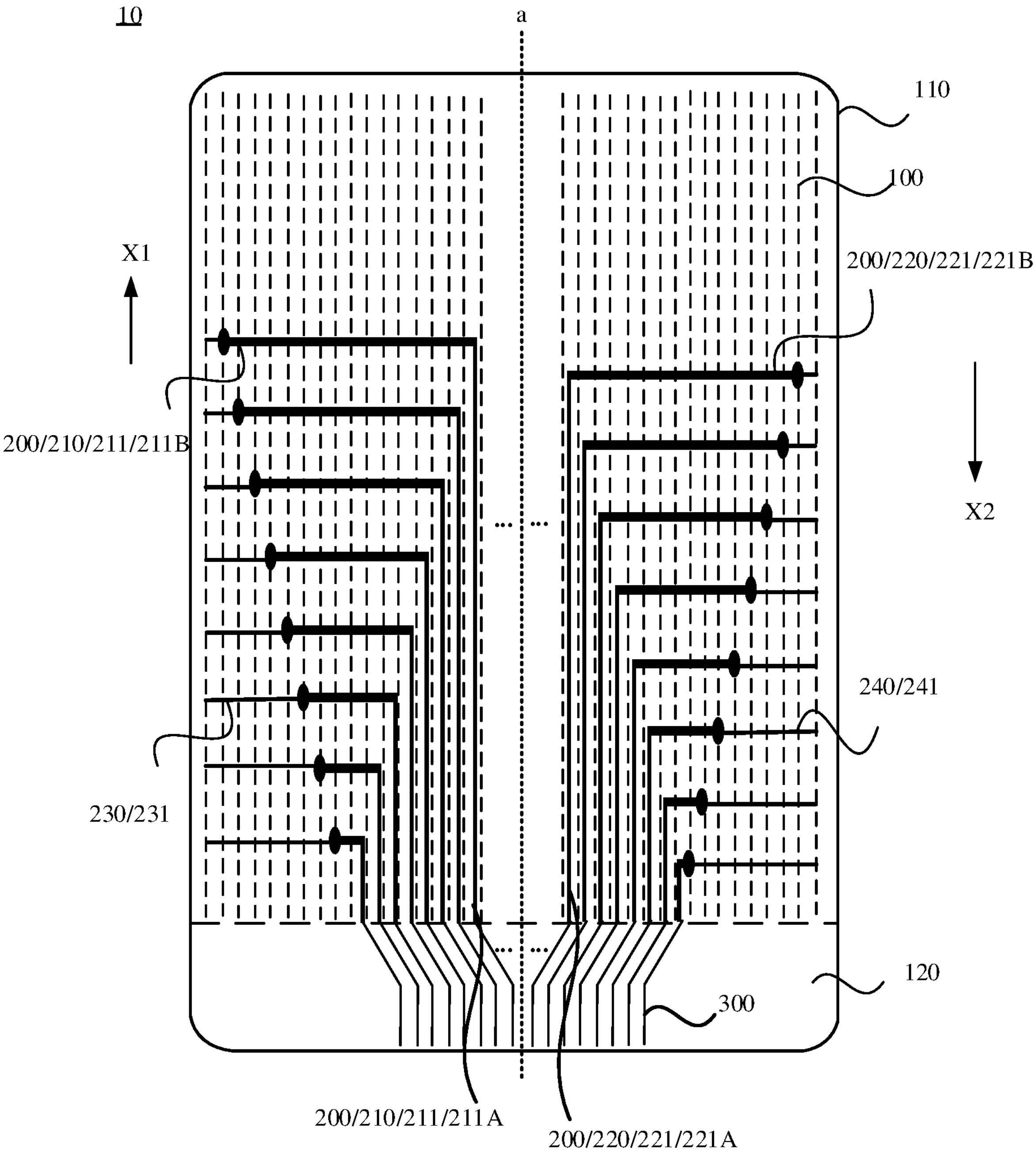
FIG. 7 is a diagram illustrating the structure of another display panel according to an embodiment of the present disclosure.
Figure 8:
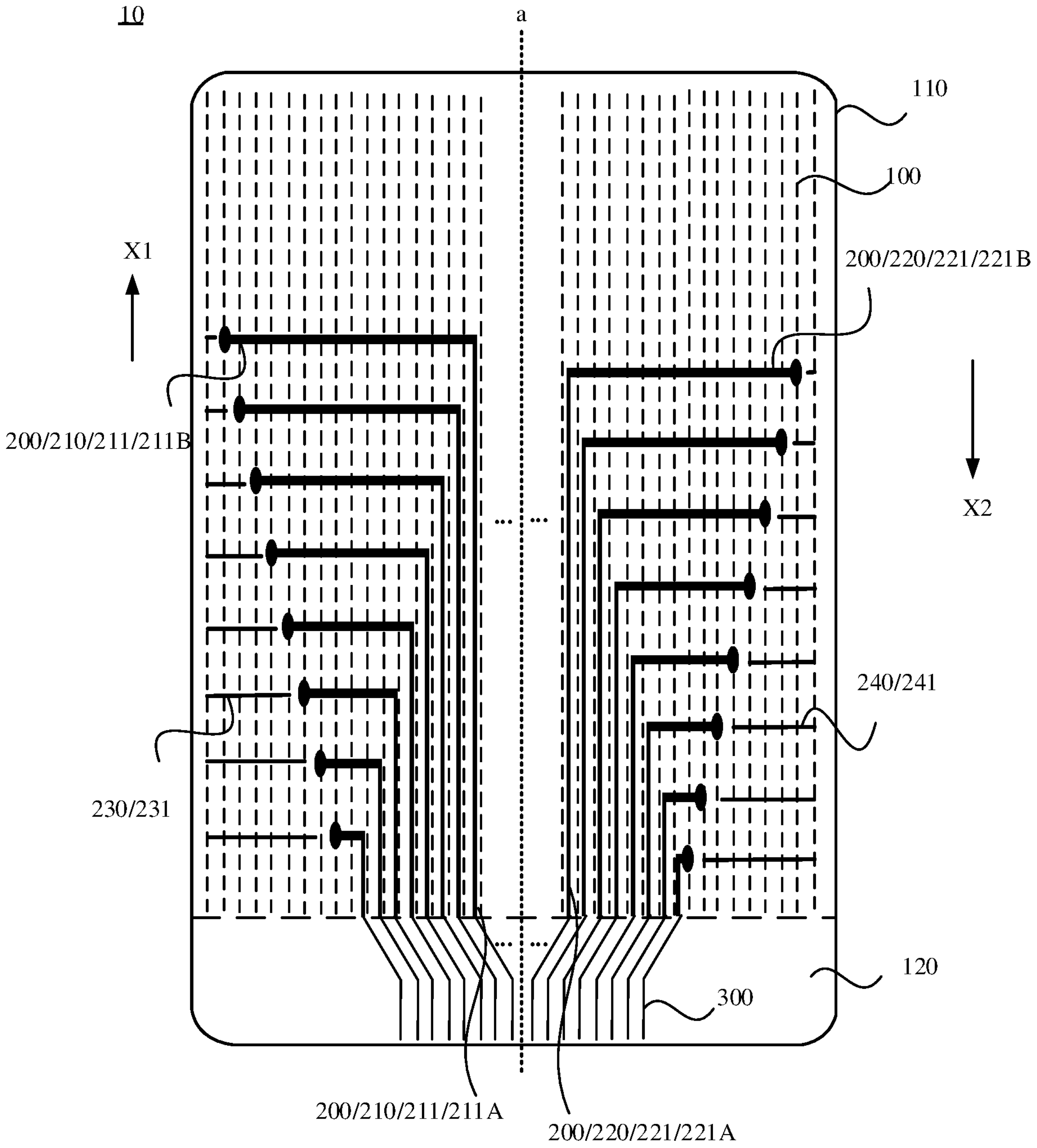
FIG. 8 is a diagram illustrating the structure of another display panel according to an embodiment of the present disclosure.

FIG. 7 is a diagram illustrating the structure of another display panel according to an embodiment of the present disclosure, and FIG. 8 is a diagram illustrating the structure of another display panel according to an embodiment of the present disclosure. Referring to FIG. 7 and FIG. 8, the display panel 10 further includes a first virtual wire group 230 and a second virtual wire group 240. The first virtual wire group 230 includes multiple first virtual wires 231, and the multiple first virtual wires 231 are located on a side of the second wire section 211B away from the first central axis a; and along the direction X2 from which the display region 112 points to the non-display region 120, extension lengths of the multiple first virtual wires 231 gradually increase. The second virtual wire group 240 includes multiple second virtual wires 241, and the multiple second virtual wires 241 are located on a side of the fourth wire section 221B away from the first central axis a; and along the direction from which the display region 110 points to the non-display region 120, extension lengths of the multiple second virtual wires 241 gradually increase.

The display panel 10 further includes the first virtual wire group 230 and the second virtual wire group 240. The first virtual wire group 230 and the second virtual wire group 240 each includes multiple virtual wires, and the virtual wires do not affect the normal signal transmission in the display panel 10. Referring to FIG. 7 and FIG. 8, the first virtual wires 231 and the second virtual wires 241 are each disposed on a side away from the first central axis a compared with the connection wires 200.

In an embodiment, based on the case where the extension lengths of the second wire sections 211B and the extension lengths of the fourth wire sections 221B gradually decrease along the direction X2 from which the display region 110 points to the non-display region 120, the first virtual wires 231 and the second virtual wires 241 are added, that is, the lengths of the second wire sections 211B and the lengths of the fourth wire sections 221B are compensated for, that is, the virtual wires are set to achieve the overall wiring balance of the region for disposing the connection wires 200, so that the density balance of wires disposed in different regions is ensured; furthermore, it is avoided that the light reflectivity is different in different regions of the display panel 10 due to the imbalance wire setting, and that the display effect of the display panel 10 is imbalanced.

With continued reference to FIG. 7, the first virtual wires 231 and the second wire section 211B are integrally disposed in the same layer; and the second virtual wires 241 and the fourth wire section 221B are integrally disposed in the same layer.

The first virtual wires 231 and the second wire section 211B are disposed in the same layer, and the second virtual wires 241 and the fourth wire section 221B are disposed in the same layer, so that the thickness of the display panel 10 can be reduced, which is conducive to achieve the thin design of the display panel 10. Further, based on the same-layer design, the first virtual wires 231 and the second wire section 211B may be integrally designed, and the second virtual wires 241 and the fourth wire section 221B may be integrally disposed, so that the preparation process of the display panel 10 can be reduced and the cost can be saved. Further, the virtual wires and the connection wires 200 are integrally disposed in the same layer, so that is can be avoided that via holes between the connection wires 200 and the data lines 100 are provided at the edge of the connection wires 200, and thus the stability of the punching connection can be ensured.

In an embodiment, with continued reference to FIG. 8, the first virtual wires 231 and the second wire section 211B are disposed insulated from each other in the same layer, and the second virtual wires 241 and the fourth wire section 221B are disposed insulated from each other in the same layer; and the first virtual wires 231 and the second virtual wires 241 are connected to a fixed potential terminal.

The first virtual wires 231 and the second wire section 211B are disposed in the same layer, and the second virtual wires 241 and the fourth wire section 221B are disposed in the same layer, so that the thickness of the display panel 10 can be reduced, which is conducive to achieve the thin design of the display panel 10. Further, based on the same-layer design, the first virtual wires 231 may also be disposed insulated from the second wire section 211B, and the second virtual wires 241 may also be disposed insulated from the fourth wire section 221B, that is, the first virtual wires 231 and the second virtual wires 241 are prevented from interfering with signals transmitted in the connection wires 200. Further, to avoid inducing other signals and thus affecting the normal transmission of display signals when the first virtual wires 231 and the second virtual wires 241 are disposed in a floating manner, a potential adjustment may be performed on the first virtual wires 231 and the second virtual wires 241. For example, the first virtual wires 231 and the second virtual wires 241 are connected to a fixe potential terminal, so that on the one hand, a fixed potential signal is transmitted on the first virtual wires 231 and the second virtual wires 241, and the potential is not affected by other signals and does not interfere with other signals; on the other hand, when the virtual wires are electrically connected to the fixed potential terminal, the resistance loss during the transmission of signals in the wires provided by the fixed signal terminal can be reduced, and the signal transmission effect in the display panel 10 can be improved.

It is to be noted that the position for disposing the fixed potential terminal is not specifically limited in the embodiment of the present disclosure, and the fixed potential terminal may be a terminal providing a positive voltage signal or a terminal providing a negative voltage signal.

With continued reference to FIG. 4, the first connection wire group 210 includes an h-th first connection wire 211 (shown as h in the figure) and an i-th first connection wire 211 (shown as i in the figure). The data lines 100 include an m-th data line 100 (shown as m in the figure) and an n-th data line 100 (shown as n in the figure), and the m-th data line 100 and the n-th data line 100 are located on the same side of the first central axis a, where h≠i and h and i are each a positive integer, and m≠n and m and n are each a positive integer. The h-th first connection wire 211 (shown as h in the figure) is electrically connected to the m-th data line 100 (shown as m in the figure), and the i-th first connection wire 211 (shown as i in the figure) is electrically connected to the n-th data line 100 (shown as n in the figure). A first wire section 211A of the h-th first connection wire 211 (shown as h in the figure) is located on a side of a first wire section 211A of the i-th first connection wire 211 (shown as i in the figure) away from the first central axis a, and the m-th data line 100 (shown as m in the figure) is located on a side of the n-th data line 100 (shown as n in the figure) away from the first central axis a.

The second connection wire group 220 includes a j-th second connection wire 221 (shown as j in the figure) and a k-th second connection wire 221 (shown as k in the figure), the data lines 100 include an x-th data line 100 (shown as x in the figure) and a y-th data line 100 (shown as y in the figure), and the x-th data line 100 (shown as x in the figure) and the y-th data line 100 (shown as y in the figure) are located on the same side of the first central axis a, where j≠k and j and k are each a positive integer, and x≠y and x and y are each a positive integer. The j-th second connection wire 221 (shown as j in the figure) is electrically connected to the x-th data line 100 (shown as x in the figure), and the k-th second connection wire 221 (shown as k in the figure) is electrically connected to the y-th data line 100 (shown as y in the figure). A third wire section 221A of the j-th second connection wire 221 (shown as j in the figure) is located on a side of a third wire section 221A of the k-th second connection wire 221 (shown as k in the figure) away from the first central axis a, and the x-th data line 100 (shown as x in the figure) is located on a side of the y-th data line 100 (shown as y in the figure) away from the first central axis a.

The first connection wire group 210 includes multiple first connection wires 211. As shown in FIG. 4, an example is illustrated where the first connection wire group 210 includes the h-th first connection wire 211 (shown as h in the figure) and the i-th first connection wire 211 (shown as i in the figure). The first wire section 211A of the h-th first connection wire 211 is closer to the first central axis a than the first wire section 211A of the i-th first connection wire 211, while the m-th data line 100 (shown as m in the figure) electrically connected to the h-th first connection wire 211 is further away from the first central axis a than the n-th data line 100 (shown as n in the figure) electrically connected to the i-th first connection wire 211. In other words, in the first connection wire group 210, along the extension direction X1 of the data line 100, a first connection wire 211 whose extension length of the first wire section 211A of the first connection wire 211 is relatively long has a relatively short transverse extension length, that is, the second wire section 211B is relatively short; a first connection wire 211 whose extension length of the first wire section 211A of the first connection wire 211 is relatively short has a relatively long transverse extension length, that is, the second wire section 211B is relatively long.

Further, the wire extension trend of the second connection wires 221 in the second connection wire group 220 is the same as the wire extension trend of the first connection wire 211 in the first connection wire group 210, which is not repeated. Moreover, as shown in FIG. 4, when the second wire section 211B and the fourth wire section 221B are located between adjacent two rows of subpixels 400, the preceding position arrangement relationship can be satisfied. At the same time, referring to FIG. 5, the second wire section 211B overlaps subpixels 400 along the thickness direction (not shown in the figure) of the display panel 10, and the fourth wire section 221B overlaps subpixels 400 along the thickness direction (not shown in the figure) of the display panel 10, which are not repeated. In summary, first connection wires 211 and second connection wires 221 at different positions are disposed to be electrically connected to data lines 100 at different positions, so that for the first connection wire group 210 and the second connection wire group 220, a connection wire whose extension length along the extension direction X1 of the data lines 100 is relative long has a relatively short transverse extension length, that is, has a relatively short second wire section 211B and a relatively short fourth wire section 221B; and the connection wire whose extension length along the extension direction X1 of the data lines 100 is relative short has a relatively long transverse extension length, that is, has a relatively long second wire section 211B and a relatively long fourth wire section 221B. In this manner, an adjustment is performed on lengths in different directions of the connection wires 200, so that the loss of data signals on different connection wires 200 is adjusted, and the balance and stability of data signal transmission are ensured.

Figure 9:
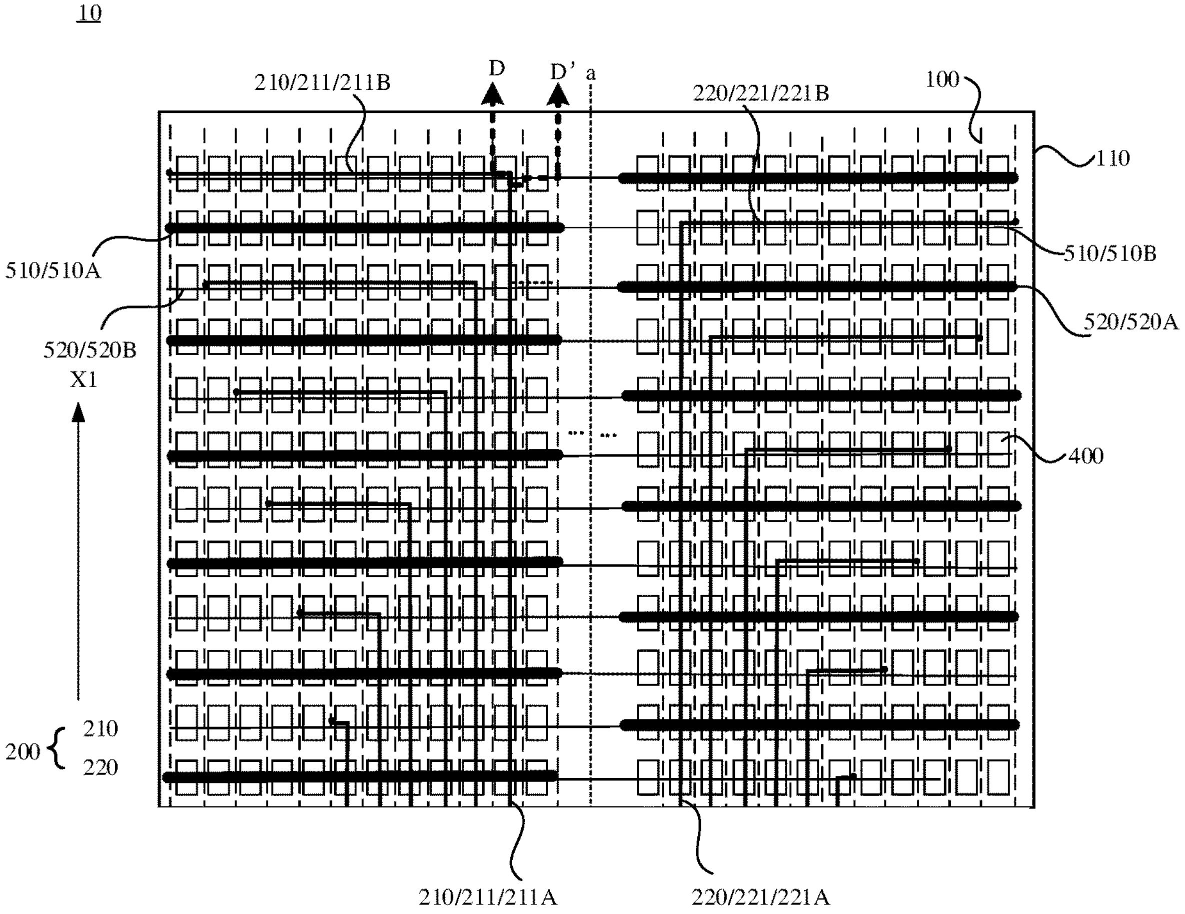
FIG. 9 is another enlarged diagram of the region for disposing the connection wires in FIG. 1.

FIG. 9 is another enlarged diagram of the region for disposing the connection wires in FIG. 1. Referring to FIG. 9, the display panel 10 further includes power supply signal lines 500 located in the display region 110, where the extension direction of the power supply signal lines 500 is parallel to the extension direction of the second wire section 211B. A power supply signal line 500 includes a first power supply signal line 510 and a second power supply signal line 520 which are disposed adjacent to each other in the extension direction X1 of the data lines 100. The first power supply signal line 510 includes a first power supply section 510A and a second power supply section 510B which are connected to each other, the first power supply section 510A is located between adjacent two second wire sections 211B, along the thickness direction of the display panel 10, the second power supply section 510B and a fourth wire section 221B overlap the same row of subpixels 400, and the line width of the first power supply section 510A is greater than the line width of the second power supply section 510B; and/or the second power supply signal line 520 includes a third power supply section 520A and a fourth power supply section 520B which are connected to each other, the third power supply section 520A is located between adjacent two fourth wire sections 221B, along the thickness direction of the display panel 10, the fourth power supply section 520B and a second wire section 211B overlap the same row of subpixels 400, and the line width of the third power supply section 520A is greater than the line width of the fourth power supply section 520B.

The display panel 10 further includes multiple power supply signal lines 500. The power supply signal lines 500 are disposed to achieve the transmission of power supply signals to the subpixels 400, so that the display and light emission of the subpixels 400 are ensured, and thereby the display effect of the display panel 10 is ensured. The extension direction of the power supply signal lines 500 is parallel to the extension direction of the second wire section 211B and the extension direction of the fourth wire section 221B, and a power supply signal line 500 includes a first power supply signal line 510 and a second power supply signal line 520 which are disposed adjacent to each other in the extension direction X1 of the data lines 100, that is, power supply signals can be provided for different rows of subpixels 400.

Further, when the connection wires 200 and the power supply signal lines 500 are all disposed in the display region 110, to prevent signal coupling and crosstalk from being generated by the connection wires 200 and the power supply signal lines 500 during signal transmission and thereby affecting the transmission of signals in the display panel 10, the first connection wire group 210 and the second connection wire group 220 are designed asymmetrically about the first central axis a, that is, it is ensured that the first connection wire group 210 and the second connection wire group 220 balance and reduce signal coupling and crosstalk generated by the power supply signal lines 500, so that the signal transmission of the display panel 10 is ensured.

Further, referring to FIG. 9, a power supply signal line 500 includes a first power supply signal line 510 and a second power supply signal line 520 which are disposed adjacent to each other in the extension direction X1 of the data lines 100. The first power supply signal line 510 includes a first power supply section 510A and a second power supply section 510B which are connected to each other. The first power supply section 510A is located between adjacent two second wire sections 211B, and the distance between the first power supply section 510A and the adjacent two second wire sections 211B is relatively large; the second power supply section 510B and a fourth wire section 221B overlap the same row of subpixels 400, that is, the distance between the second power supply section 510B and the adjacent fourth wire section 221B is relatively small. In this manner, in a case of reducing signal coupling and crosstalk generated by the power supply signal wires 500 and the connection wires 200, the line width of the first power supply section 510A is set to be greater than the line width of the second power supply section 510B, thereby reducing the loss of power supply signals during transmission on the first power supply section 510A, reducing the overall loss of signals during transmission on the power supply signal lines 500, and ensuring the stability of signal transmission of the display panel 10.

The second power supply signal line 520 includes a third power supply section 520A and a fourth power supply section 520B which are connected to each other. The third power supply section 520A is located between adjacent two fourth wire sections 221B, and the distance between the third power supply section 520A and the adjacent two fourth wire sections 221B is relatively large; the fourth power supply section 520B and a second wire section 211B overlap the same row of subpixels 400, that is, the distance between the fourth power supply section 520B and the adjacent second wire section 211B is relatively small. In this manner, in the case of reducing signal coupling and crosstalk generated by the power supply signal wires 500 and the connection wires 200, the line width of the third power supply section 520A is set to be greater than the line width of the fourth power supply section 520B, thereby reducing the loss of power supply signals during transmission on the third power supply section 520A, reducing the overall loss of signals during transmission on the power supply signal lines 500, and ensuring the stability of signal transmission of the display panel 10.

With continued reference to FIG. 9, the power supply signal lines 500 include positive power supply signal lines and/or negative power supply signal lines.

In an embodiment, the power supply signal lines 500 include positive power supply signal lines which, that is, transmit PVDD signals, or the power supply signal lines 500 include negative power supply signal lines which, that is, transmit PVEE signals, or the power supply signal lines 500 include positive power supply signal lines and negative power supply signal lines which, that is, transmit PVDD signals and PVEE signals, which is not specifically limited in the embodiment of the present disclosure.

It is to be noted that the power supply signal lines 500 include positive power supply signal lines and negative power supply signal lines, representing that part of the virtual wires are connected to the positive power supply signal lines and part of the virtual wires are connected to the negative power supply signal line, rather than that the same virtual wire is connected to both a positive power supply signal line and a negative power supply signal line.

Figure 10:
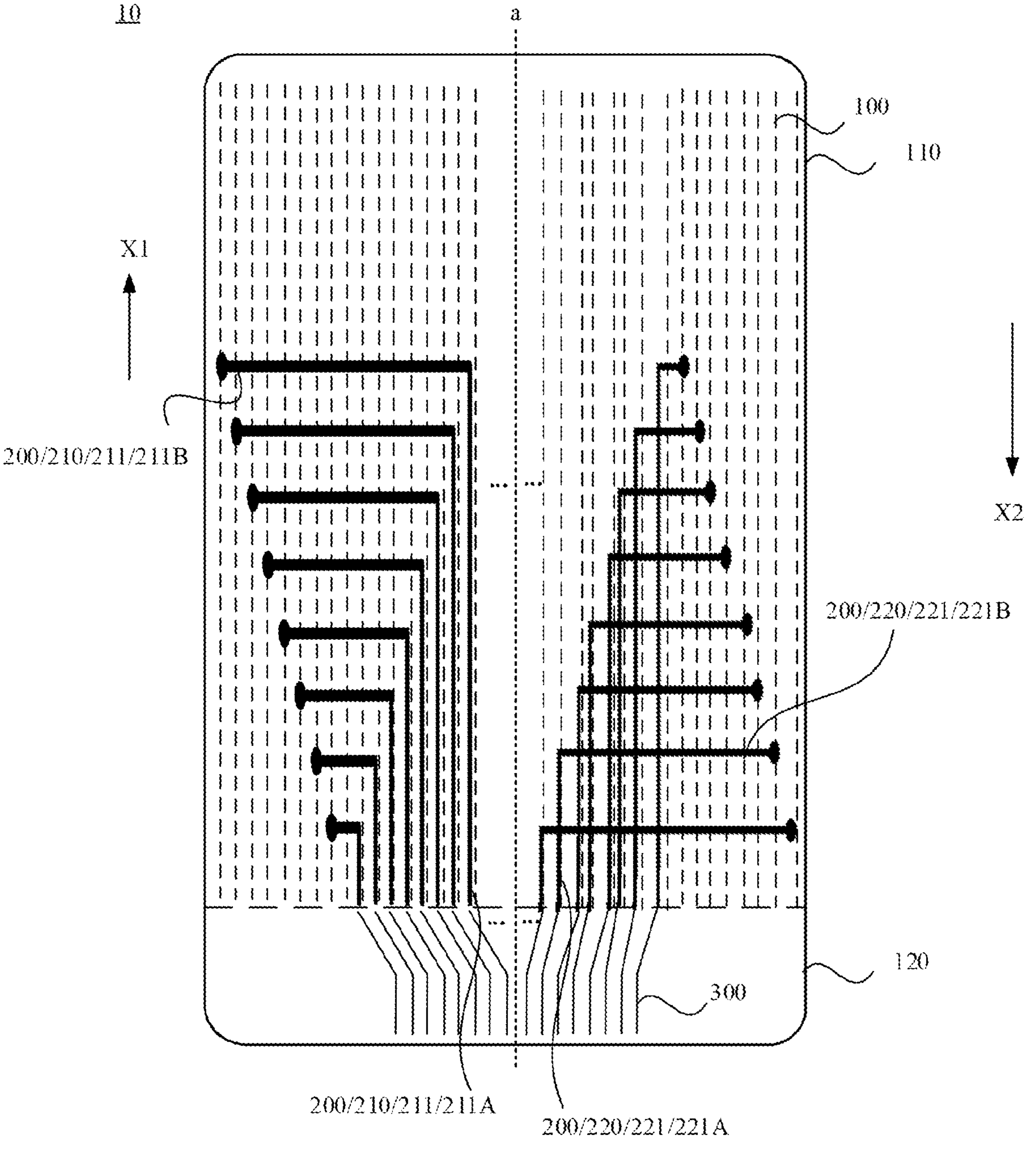
FIG. 10 is a diagram illustrating the structure of another display panel according to an embodiment of the present disclosure.
Figure 11:
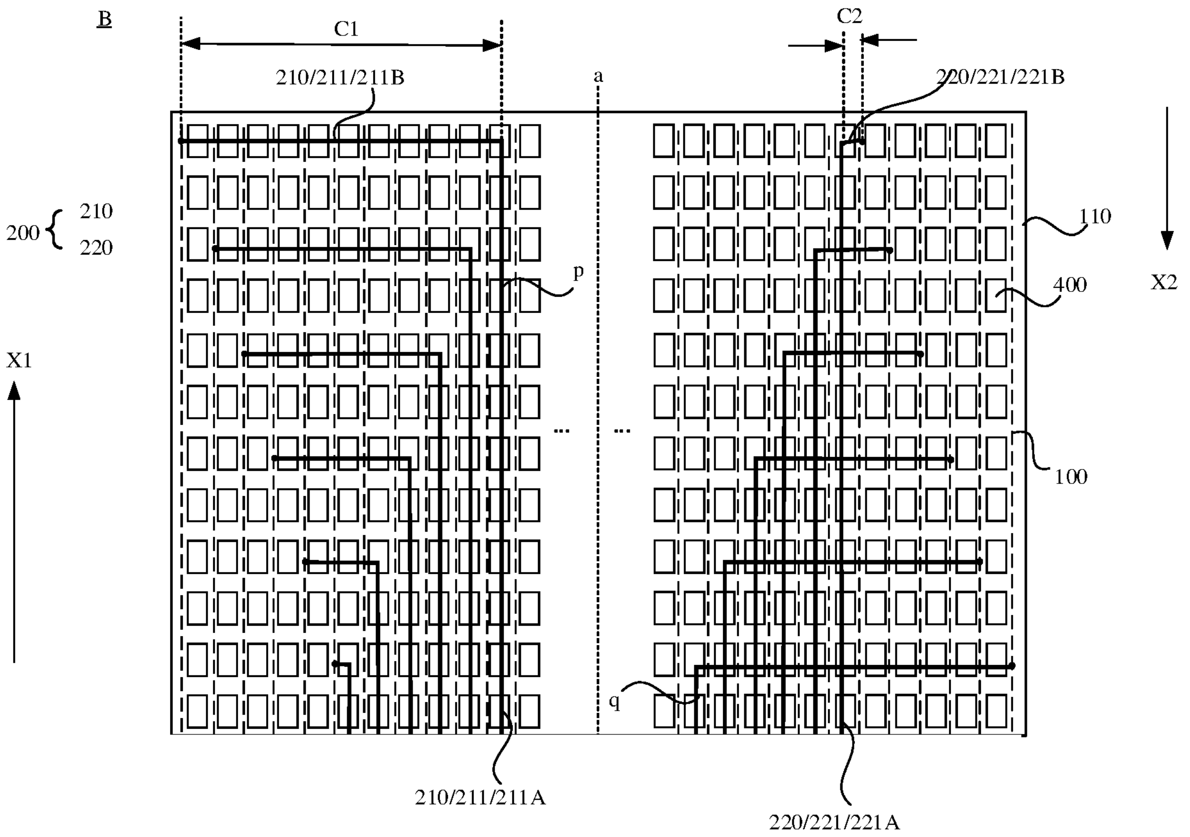
FIG. 11 is an enlarged diagram of a region for disposing connection wires in FIG. 10.

FIG. 10 is a diagram illustrating the structure of another display panel according to an embodiment of the present disclosure, and FIG. 11 is an enlarged diagram of a region for disposing connection wires in FIG. 10. Referring to FIG. 2, FIG. 10 and FIG. 11, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The display panel further includes multiple subpixels 400 located in the display region 110, and the multiple subpixels 400 are arranged in an array. Along the thickness direction of the display panel 10, the extension length of a second wire section 211B overlapping a row of subpixels 400 is different from the extension length of a fourth wire section 221B overlapping the row of subpixels 400.

A first connection wire 211 includes a first wire section 211A and a second wire section 211B, and a second connection wire 221 includes a third wire section 221A and a fourth wire section 221B. Wire sections which are connected to each other and whose extension directions intersect are set, so that electrical connection in the display panel 10 between the data lines 100 in the display region 110 and the signal wires 300 in the non-display region 120 is achieved through the connection wires 200, various arrangements of the connection wires 200 are achieved through the adjustment on different wire sections, and the diversity of the display panel 10 is improved.

Further, the display region 110 includes multiple array subpixels 400, and the subpixels 400 are driven to emit light, so as to achieve the display function of the display panel 10. The subpixels 400 include red subpixels, green subpixels and blue subpixels, and the color and type of the subpixels 400 are not specifically limited in the embodiment of the present disclosure.

Further, referring to FIG. 2, FIG. 10 and FIG. 11, along the thickness direction of the display panel 10, the extension length of a second wire section 211B overlapping a row of subpixels 400 is different from the extension length of a fourth wire section 221B overlapping the row of subpixels 400, so that the first connection wire group 210 and the second connection wire group 220 are disposed asymmetrically about the first central axis a. Referring to FIG. 11, along the thickness direction of the display panel 10, the extension length of a second wire section 211B overlapping a row of subpixels 400 is C1, the extension length of a fourth wire section 221B overlapping the row of subpixels 400 is C2, and C1 is greater than C2. The first connection wire group 210 and the second connection wire group 220 are disposed asymmetrically, so that crosstalk of signal lines existing in the display panel 10 is balanced, and the display balance of the display panel 10 is improved.

With continued reference to FIG. 9, FIG. 10 and FIG. 11, along the direction X2 from which the display region 110 points to the non-display region 120, extension lengths of second wire sections 211B gradually decrease, and extension lengths of fourth wire sections 221B gradually increase.

As shown in FIG. 6, the display panel 10 further includes a power supply signal bus 500A located in the non-display region 120 and power supply signal lines 500 connected to the power supply signal bus 500A, and power supply signals flow from the non-display region 120 to the display region 110. Since line resistance exists in the power supply signal lines 500, to ensure the overall signal transmission effect of the display panel 10, that is, to reduce overall crosstalk, the extension lengths of the second wire sections 211B of the first connection wires 211 are adjusted.

In an embodiment, along the direction X2 from which the display region 110 points to the non-display region 120, the extension lengths of the second wire sections 211B gradually decrease, that is, extension lengths of positions where coupling crosstalk is likely to generate in the display panel 10 are reduced, so that the transmission stability and balance of signals in the wires in the display panel 10 are improved In a case where along the thickness direction of the display panel 10, the extension length of a second wire section 211B overlapping a row of subpixels 400 is different from the extension length of a fourth wire section 221B overlapping the row of subpixels 400, the extension lengths of the second wire sections 211B along the direction X2 from which the display region 110 points to the non-display region 120 is in a decreasing trend, and then the extension lengths of the fourth wire sections 221B along the direction X2 from which the display region 110 points to the non-display region 120 may be in an increasing trend, so as to ensure the arrangement that the first connection wire group 210 and the second connection wire group 220 are asymmetrical about the first central axis a.

With continued reference to FIG. 10 and FIG. 11, the first connection wire group 210 includes a p-th first connection wire 211 (shown as p in the figure), and the second connection wire group 220 includes a q-th second connection wire 221 (shown as q in the figure). A straight line where a first wire section 211A of the p-th first connection wire 221 (shown as p in the figure) is located and a straight line where a third wire section 221A of the q-th second connection wire 221 (shown as q in the figure) is located are symmetrical about the first central axis a. The extension length of a second wire section 211B of the p-th first connection wire 221 (shown as p in the figure) is the same as the extension length of a fourth wire section 221B of the q-th second connection wire 221 (shown as q in the figure).

In an embodiment, referring to FIG. 11, the first connection wire group 210 includes the p-th first connection wire 211 (shown as p in the figure), and the second connection wire group 220 includes the q-th second connection wire 221 (shown as q in the figure). The value of p and the value of q are not specifically limited in the embodiment of the present disclosure. In a case where along the direction X2 from which the display region 110 points to the non-display region 120, the extension lengths of the second wire sections 211B gradually decrease and the extension lengths of the fourth wire sections 221B gradually increase, and the straight line where the first wire section 211A of the p-th first connection wire 211 (shown as p in the figure) is located and the straight line where the third wire section 221A of the q-th second connection wire 221 (shown as q in the figure) is located are symmetrical about the first central axis a, the extension length of the second wire section 211B is the same as the extension length of the fourth wire section 221B. That is, in the first connection wire group 210 and the second connection wire group 220, when the first wire section 211A of the first connection wire 211 and the third wire section 221A of the second connection wire 221 are symmetrical about the first central axial a, and the extension length of the second wire section 211B of the first connection wire 211 is same as the extension length of the fourth wire section 221B of the second connection wire 221, the extension length of the first wire section 211A of the first connection wire 211 and the extension length of the third wire section 221A of the second connection wire 221 may be adjusted, so as to achieve the asymmetrical arrangement of the first connection wire group 210 and the second connection wire group 220, and ensure the display effect of the display panel.

Figure 12:
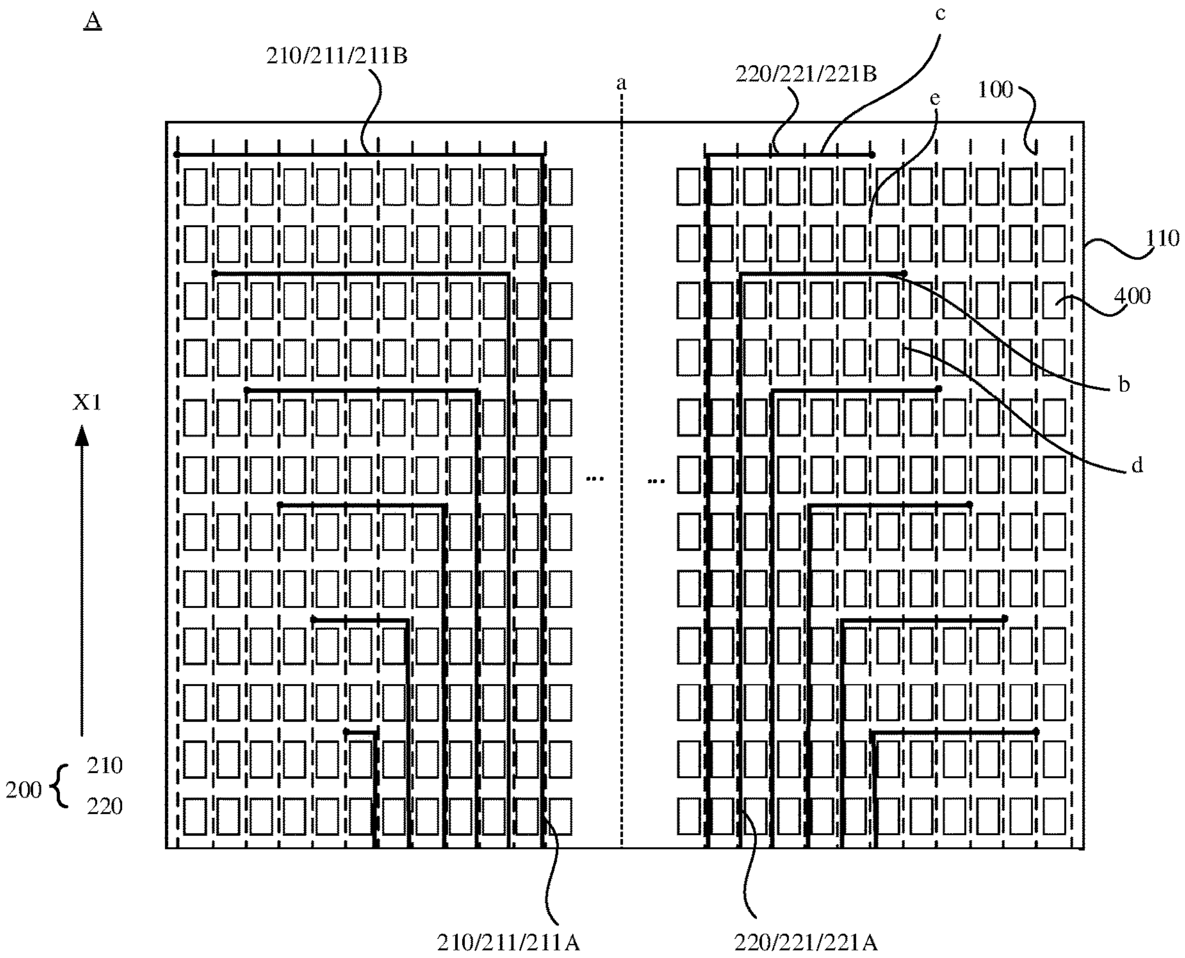
FIG. 12 is another enlarged diagram of the region for disposing the connection wires in FIG. 1.

FIG. 12 is another enlarged diagram of the region for disposing the connection wires in FIG. 1. Referring to FIG. 2, FIG. 6 and FIG. 12, along the direction X2 from which the display region 110 points to the non-display region 120, extension lengths of second wire connections 211B gradually decrease. The second connection wire group 220 includes a b-th second connection wire 221 (shown as b in the figure) and a c-th second connection wire 221 (shown as c in the figure), the data lines 100 include a d-th data line 100 (shown as d in the figure) and an e-th data line 100 (shown as e in the figure), and the d-th data line 100 (shown as d in the figure) and the e-th data line 100 (shown as e in the figure) are located on the same side of the first central axis a, where b≠c and b and c are each a positive integer, and d≠e and d and e are each a positive integer. The b-th second connection wire 221 (shown as b in the figure) is electrically connected to the d-th data line 100 (shown as d in the figure), and the c-th second connection wire 221 (shown as c in the figure) is electrically connected to the e-th data line 100 (shown as e in the figure). A third wire section 221A of the b-th second connection wire 221 (shown as b in the figure) is located on a side of a third wire section 221B of the c-th second connection wire (shown as c in the figure) away from the first central axis a, and the d-th data line 100 (shown as d in the figure) is located on a side of the e-th data line 100 (shown as e in the figure) away from the first central axis a.

As shown in FIG. 6, the display panel 10 further includes a power supply signal bus 500A located in the non-display region 120 and power supply signal lines 500 connected to the power supply signal bus 500A, and power supply signals flow from the non-display region 120 to the display region 110. Since line resistance exists in the power supply signal lines 500, to ensure the overall signal transmission effect of the display panel 10, that is, to reduce overall crosstalk, the extension lengths of the second wire sections 211B of the first connection wires 211 are adjusted.

In an embodiment, along the direction X2 from which the display region 110 points to the non-display region 120, the extension lengths of the second wire sections 211B gradually decrease, that is, extension lengths of positions where coupling crosstalk is likely to generate in the display panel 10 are reduced, so that the transmission stability and balance of signals in the wires in the display panel 10 are improved Further, the first connection wire group 210 includes multiple first connection wires 211. As shown in FIG. 12, the b-th second connection wire 221 (shown as b in the figure) and the c-th second connection wire 221 (shown as c in the figure) are taken as an example for illustration.

In an embodiment, the third wire section 221A of the b-th second connection wire 221 (shown as b in the figure) is further away from the first central axis a than the third wire section 221A of the c-th second connection wire 221 (shown as c in the figure), while the d-th data line 100 (shown as d in the figure) electrically connected to the b-th second connection wire 221 (shown b in the figure) is further away from the first central axis a than the e-th data line 100 (shown as e in the figure) electrically connected to the c-th second connection wire 221 (shown as c in the figure). In other words, when the extension lengths of the second wire sections 211B gradually decrease along the direction X2 from which the display region 110 points to the non-display region 120, in the second connection wire group 220, along the extension direction X1 of the data lines 100, a second connection wire 221 whose extension length of the third wire section 221A of the second connection wire 221 is relatively long has a relatively short transverse extension length, while a second connection wire 221 whose extension length of the third wire section 221A of the second connection wire 221 is relatively short has a relatively long transverse extension length. In this manner, the loss of data signals from the data lines 100 on different connection wires 200 is adjusted, and the balance and stability of data signal transmission are ensured.

Figure 13:
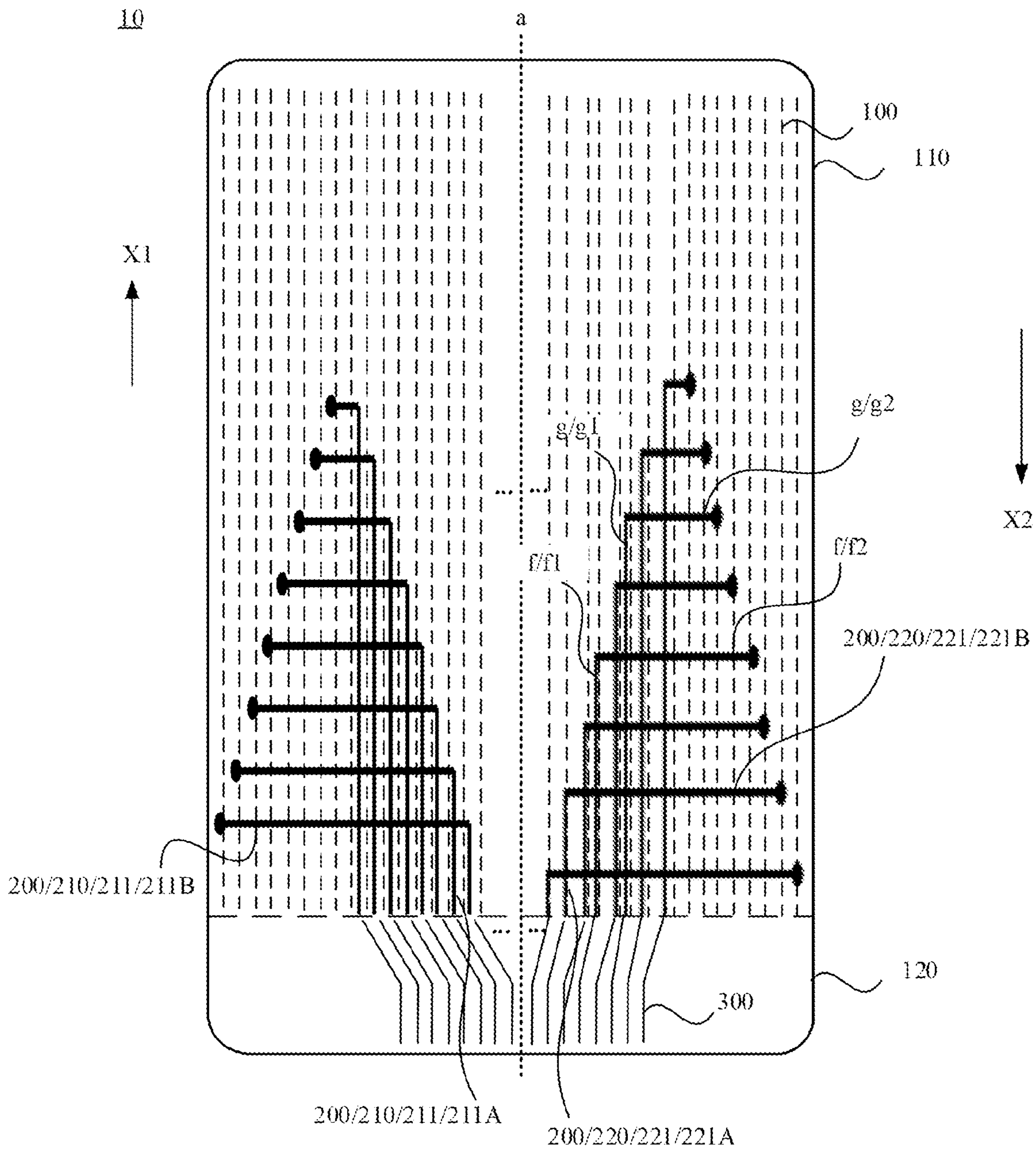
FIG. 13 is a diagram illustrating the structure of another display panel according to an embodiment of the present disclosure.
Figure 14:
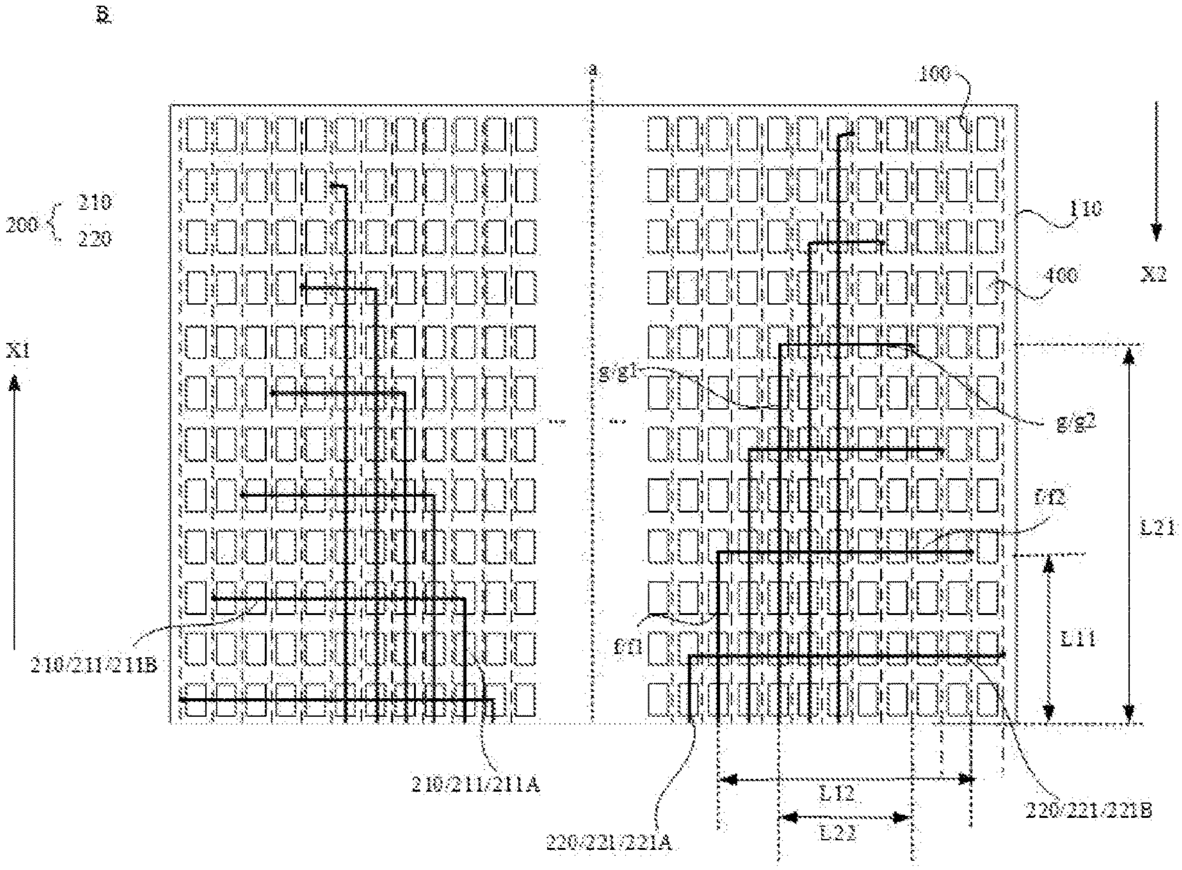
FIG. 14 is an enlarged diagram of a region for disposing connection wires in FIG. 13.

FIG. 13 is a diagram illustrating the structure of another display panel according to an embodiment of the present disclosure, and FIG. 14 is an enlarged diagram of a region for disposing connection wires in FIG. 13. Referring to FIG. 13 and FIG. 14, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The connection wires 200 include an f-th connection wire 200 (shown as f in the figure) and a g-th connection wire 200 (shown as g in the figure), the f-th connection wire 200 (shown as fin the figure) is located in the first connection wire group 210 or the second connection wire group 220, and the g-th connection wire 200 (shown as g in the figure) is located in the first connection wire group 210 or the second connection wire group 220. The f-th connection wire 200 (shown as fin the figure) includes an f-th subsection f1 and an f-th sub-wire f2, and the g-th connection wire 200 (shown as g in the figure) includes a g-th subsection g1 and a g-th sub-wire g2, where the f-th subsection f1 is a first wire section 211A or a third wire section 221A, the f-th sub-wire f2 is a second wire section 211B or a fourth wire section 221B, the g-th subsection g1 is a first wire section 211A or a third wire section 221A, and the g-th sub-wire g2 is a second wire section 211B or a fourth wire section 221B. The length of the f-th subsection f1, the length of the f-th sub-wire f2, the length of the g-th subsection g1 and the length the g-th sub-wire g2 are respectively L11, L12, L21 and L22, where $(L11-L21)\times(L12-L22)\leq 0$.

In an embodiment, a first connection wire 211 includes a first wire section 211A and a second wire section 211B, and a second connection wire 221 includes a third wire section 221A and a fourth wire section 221B. Wire sections which are connected to each other and whose extension directions intersect are set, so that electrical connection in the display panel 10 between the data lines 100 in the display region 110 and the signal wires 300 in the non-display region 120 is achieved through the connection wires 200, various arrangements of the connection wires 200 are achieved through the adjustment on different wire sections, and the diversity of the display panel 10 is improved.

In an embodiment, the connection wires 200 include the f-th connection wire 200 (shown as fin the figure) and the g-th connection wire 200 (shown as g in the figure), and the f-th connection wire 200 (shown as f in the figure) and the g-th connection wire 200 (shown as g in the figure) may both be first connection wires 211 or may both be second connection wires 221; or one of the f-th connection wire 200 and the g-th connection wire 200 is a first connection wire 211 and the other of the f-th connection wire 200 and the g-th connection wire 200 is a second connection wire 221, which is not specifically limited in the embodiment of the present disclosure. Referring to FIG. 13 and FIG. 14, an example is illustrated where the f-th connection wire 200 (shown as fin the figure) and the g-th connection wire 200 (shown as g in the figure) are second connection wires 221.

In an embodiment, referring to FIG. 13 and FIG. 14, the f-th connection wire 200 (shown as fin the figure) includes the f-th subsection f1 and the f-th sub-wire f2, and the g-th connection wire 200 (shown as g in the figure) includes the g-th subsection g1 and the g-th sub-wire g2. The f-th subsection f1 and the g-th subsection g1 are third wire sections 221A of different second connection wires 221, respectively, and the f-th sub-wire f2 and the g-th sub-wire g2 are fourth wire sections 221B of different second connection wires 221, respectively.

In an embodiment, with continued reference to FIG. 13 and FIG. 14, the length of the f-th subsection f1 is L11, the length of the g-th subsection g1 is L21, and the length L11 of the f-th subsection f1 is less than the length L21 of the g-th subsection g1. At the same time, the length of the f-th sub-wire f2 is L12, the length of the g-th sub-wire g2 is L22, and the length L12 of the f-th sub-wire f2 is greater than the length L22 of the g-th sub-wire g2. That is, when L11 is less than L21, L12 is greater than L22, so as to satisfy that $(L11-L21)\times(L12-L22)\leq 0$. Similarly, when the length L11 of the f-th subsection f1 is greater than the length L21 of the g-th subsection g1, the length L12 of the f-th sub-wire f2 is less than the length L22 of the g-th sub-wire g2; that is, when L11 is greater than L21 (not shown in the figure), L12 is less than L22, and it is also satisfied that $(L11-L21)\times(L12-L22)\leq 0$. Only one case is illustrated in the figure, which is not specifically limited in the embodiment of the present disclosure.

When it is ensured that the first connection wire group 210 and the second connection wire group 220 are disposed asymmetrically about the first central axis a, crosstalk of signal transmission in the display panel 10 can be balanced or reduced. Extension lengths of different connection wires 200 in different directions are adjusted, that is, when the extension lengths of the connection wires 200 along the extension direction X1 of the data lines 100 are relatively short, the extension lengths of the connection wires 200 perpendicular to the extension direction X1 of the data lines may be increased, so as to avoid different degrees of loss of signals during transmission caused by large differences in resistance of the connection wires 200 at different positions, that is, to further ensure the signal transmission balance of the display panel 10, and improve the display effect of the display panel 10.

Figure 15:
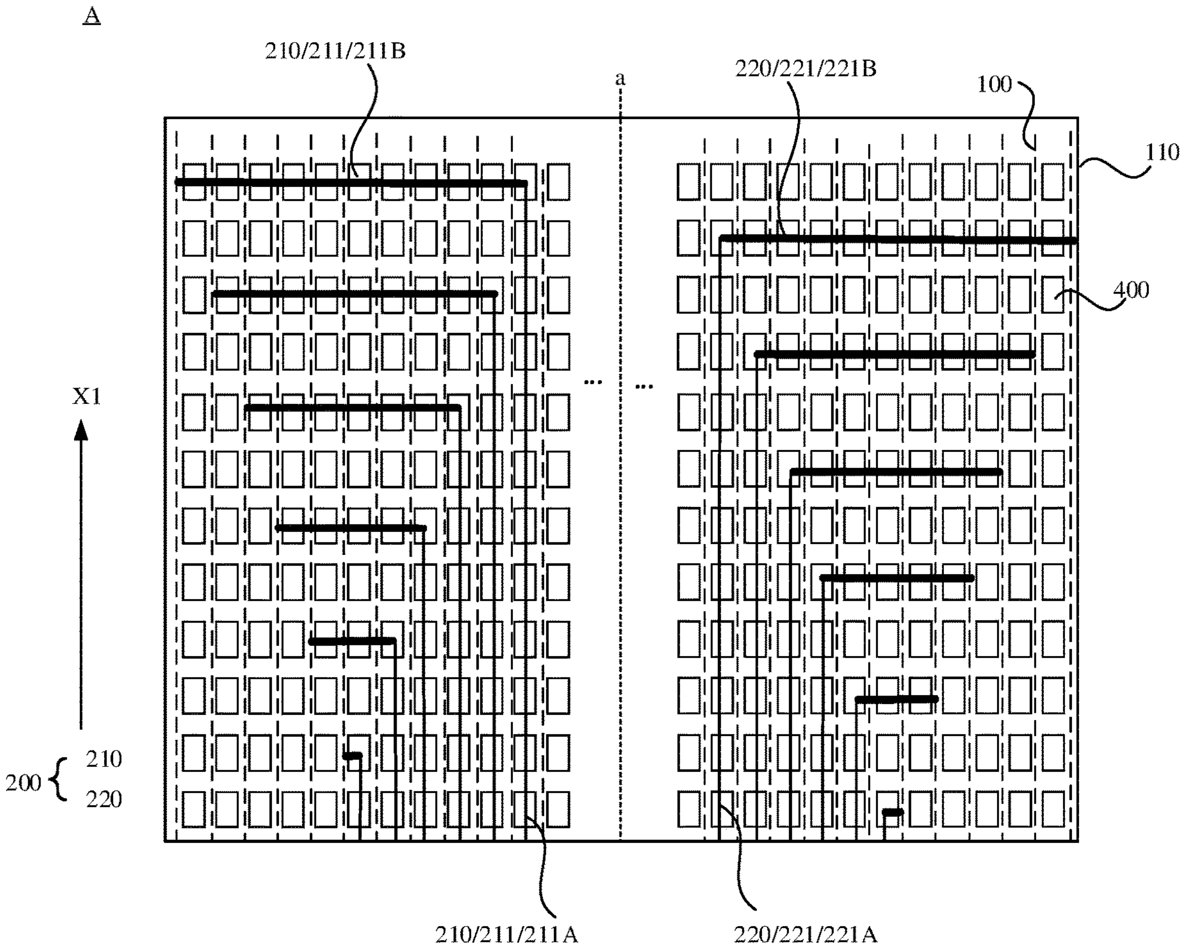
FIG. 15 is another enlarged diagram of the region for disposing the connection wires in FIG. 1.

FIG. 15 is another enlarged diagram of the region for disposing the connection wires in FIG. 1. Referring to FIG. 1 and FIG. 15, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The first wire section 211A and the third wire section 221A are both disposed in the same layer as the data lines 100 and are parallel to the extension direction of the data lines 100, and the extension direction of the second wire section 211B and the extension direction of the fourth wire section 221B both intersect the extension direction of the data lines 100. The width of the second wire section 211B is greater than the width of the first wire section 211A, and the width of the fourth wire section 221B is greater than the width of the third wire section 221A.

A first connection wire 211 includes a first wire section 211A and a second wire section 211B, and a second connection wire 221 includes a third wire section 221A and a fourth wire section 221B. The first wire section 211A and the third wire section 221A are disposed in the same layer and are parallel to the extension direction of the data lines 100, that is, the first wire section 211A and the third wire section 221A each have a relatively large contact area with the data lines 100; the extension direction of the second wire section 211B and the extension direction of the fourth wire section 221B both intersect the extension direction of the data lines 100, that is, the second wire section 211B and the fourth wire section 221B each have a relatively small contact area with the data lines 100. When signal transmission is performed in the display panel 10, crosstalk is more likely generated between the first wire section 211A as well as the third wire section 221A and the data lines 100 than between the second wire section 211B as well as the fourth wire section 221B and the data lines 100; therefore, the wire width of the first wire section 211A and the wide width of the third wire section 221A are set to be less than the wire width of the second wire section 211B and the wire width of the fourth wire section 221B, so as to reduce crosstalk generated along the extension direction X1 of the data lines 100 in the display panel 10, and ensure the stability of signal transmission of the display panel 10. Further, the first connection wire group 210 and the second connection wire group 220 are designed asymmetrically about the first central axis a, so that crosstalk generated along the direction perpendicular to the extension direction of the data lines 100 can be effectively reduced, and thus the stability of signal transmission in the display panel 10 is ensured.

Figure 16:
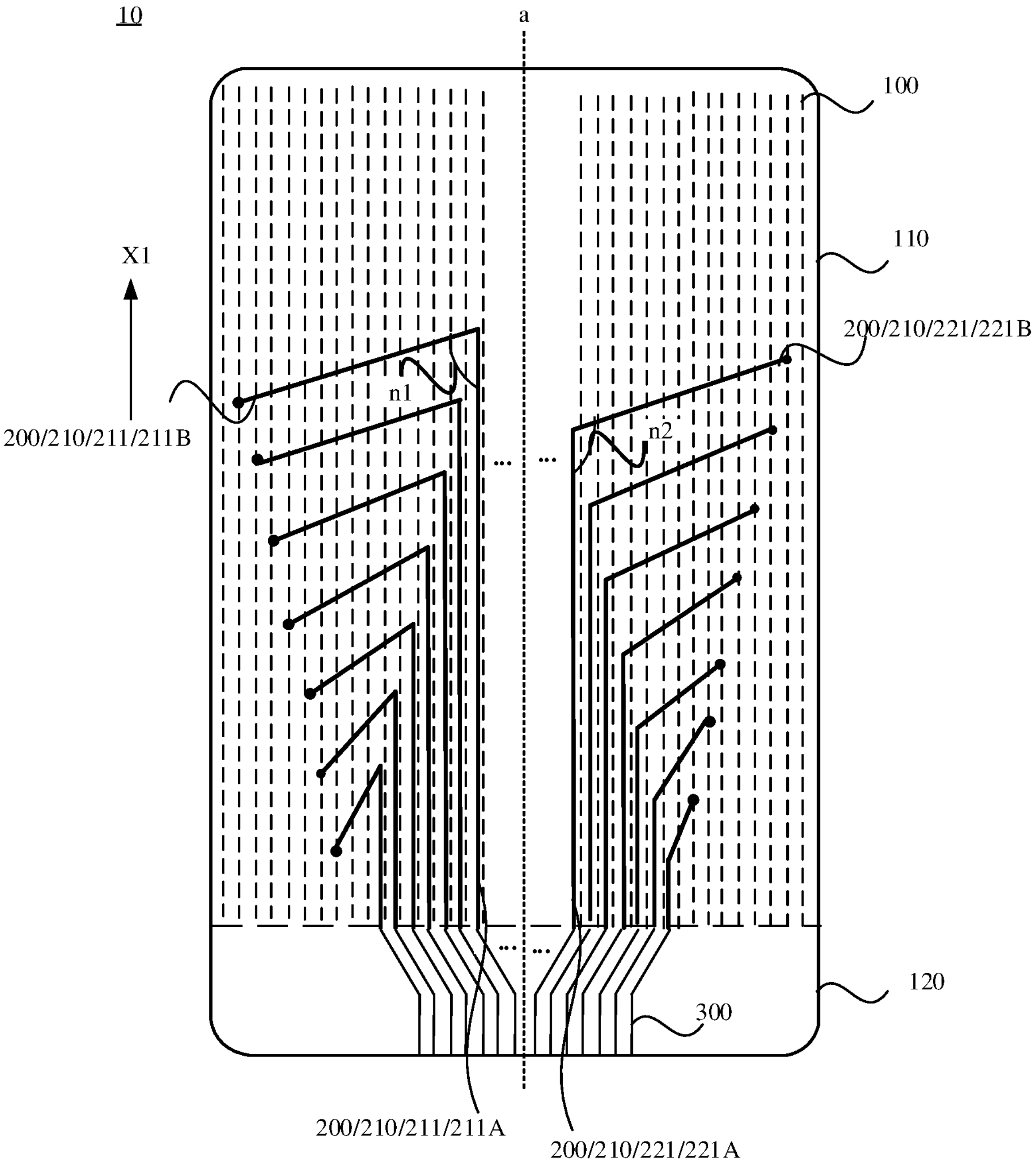
FIG. 16 is a diagram illustrating the structure of another display panel according to an embodiment of the present disclosure.

FIG. 16 is a diagram illustrating the structure of another display panel according to an embodiment of the present disclosure. Referring to FIG. 16, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The included angle between the first wire section 211A and the second wire section 211B is a first included angle n1, and the included angle between the third wire section 221A and the fourth wire section 221B is a second included angle n2, where the first included angle n1 is less than the second included angle n2.

A first connection wire 211 includes a first wire section 211A and a second wire section 211B, a second connection wire 221 includes a third wire section 221A and a fourth wire section 221B, and the first included angle n1 exists between the first wire section 211A and the second wire section 211B, and the second included angle n2 exists between the third wire section 221A and the fourth wire section 221B. Referring to FIG. 16, the first included angle n1 is different from the second included angle n2, that is, the connection inclination of the first wire section 211A and the second wire section 211B of the first connection wire 211 is different from the connection inclination of the third wire section 221A and the fourth wire section 221B of the second connection wire 221, therefore, the asymmetrical design of the first connection wire group 210 and the second connection wire group 220 about the first central axis a is achieved, so that the stability of signal transmission of the display panel 10 is ensured.

With continued reference to FIG. 4 and FIG. 5, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The display panel 10 further includes multiple subpixels 400 located in the display region 110, and the multiple subpixels 400 are arranged in an array. At least a row of subpixels 400 are disposed between adjacent two first wire sections 211A, and at least a row of subpixels 400 are disposed between adjacent two third wire sections 221A.

A first connection wire 211 includes a first wire section 211A and a second wire section 211B, and a second connection wire 221 includes a third wire section 221A and a fourth wire section 221B. Various arrangements of the connection wires 200 are achieved through the adjustment on different wire sections, and thus the diversity of the display panel 10 is improved. At the same time, the display region 110 includes multiple array subpixels 400, and the subpixels 400 are driven to emit light, so as to achieve the display function of the display panel 10. The subpixels 400 include red subpixels, green subpixels and blue subpixels, and the color and type of the subpixels 400 are not specifically limited in the embodiment of the present disclosure.

Further, referring to FIG. 4 and FIG. 5, in the first connection wire group 210, at least a row of subpixels 400 are disposed between adjacent two first wire sections 211A. The figure only illustrate an example where a row of subpixels 400 are disposed between adjacent two first wire sections 211A. In this manner, it is avoided that different first connection wires 211 are arranged too closely, and thus the generation of signal crosstalk in the display panel 10 is further reduced. The same manner is applied to the arrangement of adjacent third wire sections 221A in the second connection wire group 220, which is not repeated here.

Figure 17:
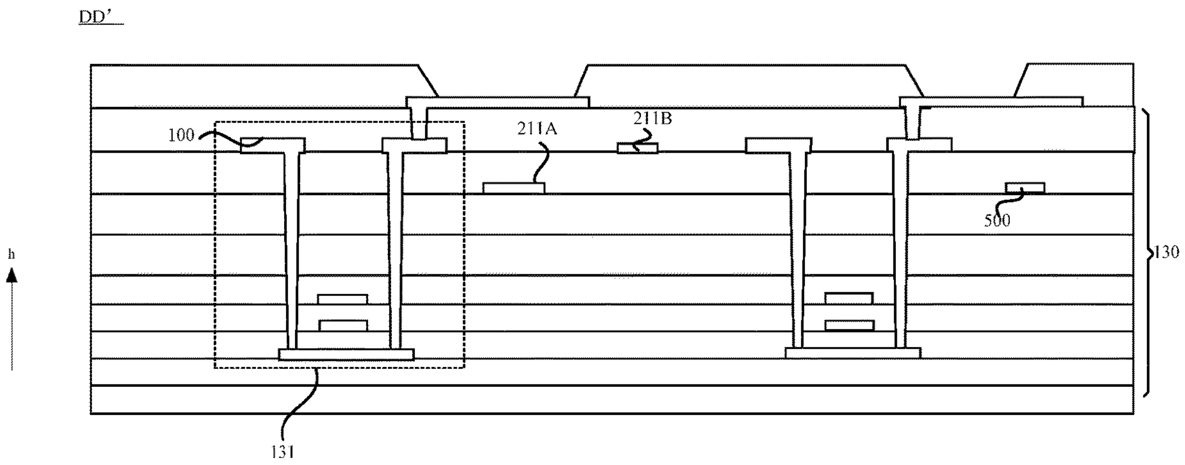
FIG. 17 is a sectional diagram taken along direction D-D' of FIG. 9.

FIG. 17 is a sectional diagram taken along direction D-D' of FIG. 9. Referring to FIG. 9 and FIG. 17, a first connection wire 211 includes a first wire section 211A and a second wire section 211B, where the first wire section 211A and the second wire section 211B are connected to each other, and the extension direction of the first wire section 211A intersects the extension direction of the second wire section 211B. A second connection wire 221 includes a third wire section 221A and a fourth wire section 221B, where the third wire section 221A and the fourth wire section 221B are connected to each other, and the extension direction of the third wire section 221A intersects the extension direction of the fourth wire section 221B. The display panel 10 further includes power supply signal lines 500 located in the display region 110, and the extension direction of the power supply signal lines 500 is parallel to the extension direction of the second wire section 211B.

The first wire section 211A and the second wire section 211B are disposed in different layers, and the third wire section 221A and the fourth wire section 221B are disposed in different layers. The first wire section 211A, the third wire section 221A and the data lines 100 are disposed in the same layer, and the second wire section 211B, the fourth wire section 221B and the power supply signal lines 500 are disposed in the same layer.

In the sectional diagram of the display region 110 of the display panel 10, the display panel 10 includes an array layer 130 and includes pixel drive circuits 131 in the array layer 130, and subpixels are driven by the pixel drive circuits 130 to display and emit light. A pixel drive circuit 131 includes an active layer, a gate, a capacitor layer, a source and a drain and the like which are disposed in a laminated manner, and those skilled in the art may adjust the film layers adaptively according to actual requirements.

Further, the first wire section 211A, the third wire section 221A and the data lines 100 may be disposed in the same layer, and the second wire section 211B, the fourth wire section 221B and power supply signal lines 500 may be disposed in the same layer. On this basis, the first wire section 211A and the second wire section 211B need to be disposed in different layers, and the third wire section 221A and the fourth wire section 221B need to be disposed in different layers. In this manner, multiple wires are disposed in the same layer, so that the thickness of the display panel 10 can be reduced, and the thin design of the display panel 10 can be achieved.

Figure 18:
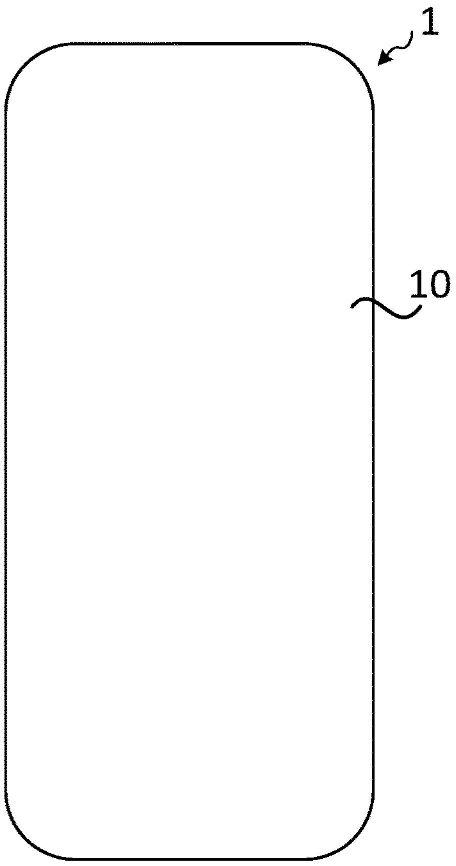
FIG. 18 is a diagram illustrating the structure of a display device according to an embodiment of the present disclosure.

Based on the same invention concept, an embodiment of the present disclosure further provides a display device. FIG. 18 is a diagram illustrating the structure of a display device according to an embodiment of the present disclosure. As shown in FIG. 18, the display device 1 includes the display panel 10 described in any of the preceding embodiments; therefore, the display device 1 provided in the embodiment of the present disclosure has the corresponding beneficial effects of the preceding embodiments, which are not repeated here. The display device 1 may be an electronic device such as a mobile phone, a computer, a smart wearable device (such as a smart watch) and an onboard display device, which is not limited in the embodiment of the present disclosure.

It is to be noted that the preceding are only preferred embodiments of the present disclosure and technical principles used therein. It is to be understood by those skilled in the art that the present disclosure is not limited to the embodiments described herein. For those skilled in the art, various apparent modifications, adaptations and substitutions can be made without departing from the scope of the present disclosure. Therefore, while the present disclosure has been described in detail via the preceding embodiments, the present disclosure is not limited to the preceding embodiments and may include more equivalent embodiments without departing from the invention concept of the present disclosure. The scope of the present disclosure is determined by the scope of the appended claims.

What is claimed is:

1. A display panel, comprising a display region and a non-display region, wherein the non-display region is located at least on a side of the display region;

wherein the display panel further comprises a plurality of data lines, a plurality of connection wires and a plurality of signal wires, wherein each of the plurality of connection wires is electrically connected to a respective one of the plurality of data lines and a respective one of the plurality of signal wires, the plurality of data lines and the plurality of connection wires are located in the display region, and the plurality of signal wires are located in the non-display region;

the plurality of connection wires comprise a first connection wire group and a second connection wire group, wherein the first connection wire group comprises a plurality of first connection wires, the second connection wire group comprises a plurality of second connection wires, the first connection wire group and the second connection wire group are located on two sides of a first central axis of the display panel respectively, and an extension direction of the first central axis is parallel to an extension direction of the plurality of data lines; and the first connection wire group and the second connection wire group are disposed asymmetrically, wherein a first connection wire of the plurality of first connection wires comprises a first wire section and a second wire section, wherein the first wire section and the second wire section are connected to each other, and an extension direction of the first wire section intersects an extension direction of the second wire section;

a second connection wire of the plurality of second connection wires comprises a third wire section and a fourth wire section, wherein the third wire section and the fourth wire section are connected to each other, and an extension direction of the third wire section intersects an extension direction of the fourth wire section;

the extension direction of the third wire section is parallel to the extension direction of the first wire section, and the extension direction of the fourth wire section is parallel to the extension direction of the second wire section;

the first connection wire group comprises V first connection wires, and the second connection wire group comprises W second connection wires, wherein the first wire section of a v-th first connection wire of the V first connection wires and the third wire section of a w-th second connection wire of the W second connection wires are symmetrical about the first central axis; and along the extension direction of the plurality of data lines, the second wire section of the v-th first connection wire and the fourth wire section of the w-th second connection wire are disposed in a staggered manner, wherein V, W, v and w are each a positive integer, $1 \leq v \leq V$, and $1 \leq w \leq W$, wherein the display panel comprises a plurality of subpixels located in the display region, wherein the plurality of subpixels are arranged in an array;

along a thickness direction of the display panel, the second wire section of the v-th first connection wire overlaps a D-th row of subpixels of the plurality of subpixels, and the fourth wire section of the w-th second connection wire overlaps an E-th row of subpixels of the plurality of subpixels, wherein v=w, and D is not equal to E.

2. The display panel according to claim 1, wherein $|V-W| \geq 1$.

3. The display panel according to claim 1, further comprising a plurality of subpixels located in the display region, wherein the plurality of subpixels are arranged in an array;

at least a row of subpixels of the plurality of subpixels are disposed between adjacent two second wire sections, and at least a row of subpixels of the plurality of subpixels are disposed between adjacent two fourth wire sections; and along the extension direction of the plurality of data lines, at least part of second wire sections are located between adjacent two fourth wire sections, and at least part of fourth wire sections are located between adjacent two second wire sections.

4. The display panel according to claim 1, wherein along a direction from which the display region points to the non-display region, extension lengths of second wire sections gradually decrease, and extension lengths of fourth wire sections gradually decrease.

5. The display panel according to claim 1, wherein the first connection wire group comprises an h-th first connection wire and an i-th first connection wire, the plurality of data lines comprise an m-th data line and an n-th data line, and the m-th data line and the n-th data line are located on a same side of the first central axis, wherein h≠i and h and i are each a positive integer, and m≠n and m and n are each a positive integer;

the h-th first connection wire is electrically connected to the m-th data line, and the i-th first connection wire is electrically connected to the n-th data line;

the first wire section of the h-th first connection wire is located on a side of a first wire section of the i-th first connection wire facing away from the first central axis, and the m-th data line is located on a side of the n-th data line facing away from the first central axis;

the second connection wire group comprises a j-th second connection wire and a k-th second connection wire, the plurality of data lines comprise an x-th data line and a y-th data line, and the x-th data line and the y-th data line are located on a same side of the first central axis, wherein j≠k and j and k are each a positive integer, and x≠y and x and y are each a positive integer;

the j-th second connection wire is electrically connected to the x-th data line, and the k-th second connection wire is electrically connected to the y-th data line; and the third wire section of the j-th second connection wire is located on a side of a third wire section of the k-th second connection wire facing away from the first central axis, and the x-th data line is located on a side of the y-th data line facing away from the first central axis.

6. The display panel according to claim 1, wherein the display panel further comprises a plurality of subpixels located in the display region, wherein the plurality of subpixels are arranged in an array; and an extension length of the second wire section overlapping a row of subpixels of the plurality of subpixels along a thickness direction of the display panel is different from an extension length of the fourth wire section overlapping the row of subpixels along the thickness direction of the display panel.

7. The display panel according to claim 1, wherein the first wire section and the third wire section are both disposed in a same layer as the plurality of data lines and are parallel to the extension direction of the plurality of data lines, and the extension direction of the second wire section and the extension direction of the fourth wire section both intersect the extension direction of the plurality of data lines; and a width of the second wire section is greater than a width of the first wire section, and a width of the fourth wire section is greater than a width of the third wire section.

8. The display panel according to claim 1, wherein the display panel further comprises a plurality of subpixels located in the display region, and the plurality of subpixels are arranged in an array; and at least a row of subpixels of the plurality of subpixels are disposed between adjacent two first wire sections, and at least a row of subpixels of the plurality of subpixels are disposed between adjacent two third wire sections.

9. The display panel according to claim 1, wherein the display panel further comprises power supply signal lines located in the display region, and an extension direction of the power supply signal lines is parallel to an extension direction of the second wire section;

the first wire section and the second wire section are disposed in different layers, and the third wire section and the fourth wire section are disposed in different layers;

the first wire section, the third wire section and the plurality of data lines are disposed in a same layer; and the second wire section, the fourth wire section and the power supply signal lines are disposed in a same layer.

10. The display panel according to claim 3, further comprising power supply signal lines located in the display region, wherein an extension direction of the power supply signal lines is parallel to the extension direction of the second wire section;

a power supply signal line of the power supply signal lines comprises a first power supply signal line and a second power supply signal line which are disposed adjacent to each other in the extension direction of the plurality of data lines; and wherein the first power supply signal line and the second power supply signal line satisfy at least one of: the first power supply signal line comprises a first power supply section and a second power supply section which are connected to each other, the first power supply section is located between adjacent two second wire sections, along a thickness direction of the display panel, the second power supply section and the fourth wire section overlap a same row of subpixels of the plurality of pixels, and a line width of the first power supply section is greater than a line width of the second power supply section; or the second power supply signal line comprises a third power supply section and a fourth power supply section which are connected to each other, the third power supply section is located between adjacent two fourth wire sections, along the thickness direction of the display panel, the fourth power supply section and the second wire section overlap a same row of subpixels of the plurality of subpixels, and a line width of the third power supply section is greater than a line width of the fourth power supply section, wherein the power supply signal lines comprise at least one of positive power supply signal lines or negative power supply signal lines.

11. The display panel according to claim 4, further comprising a first virtual wire group and a second virtual wire group, wherein the first virtual wire group comprises a plurality of first virtual wires, and the plurality of first virtual wires are located on a side of the second wire section facing away from the first central axis; and along the direction from which the display region points to the non-display region, extension lengths of the plurality of first virtual wires gradually increase; and the second virtual wire group comprises a plurality of second virtual wires, and the plurality of second virtual wires are located on a side of the fourth wire section facing away from the first central axis; and along the direction from which the display region points to the non-display region, extension lengths of the plurality of second virtual wires gradually increase, wherein the plurality of first virtual wires and the second wire section are integrally disposed in a same layer; and the plurality of second virtual wires and the fourth wire section are integrally disposed in a same layer.

12. The display panel according to claim 11, wherein the plurality of first virtual wires and the second wire section are disposed insulated from each other in a same layer, and the plurality of second virtual wires and the fourth wire section are disposed insulated from each other in a same layer; and the plurality of first virtual wires and the plurality of second virtual wires are connected to a fixed potential terminal.

13. The display panel according to claim 6, wherein along a direction from which the display region points to the non-display region, extension lengths of second wire sections gradually decrease, and extension lengths of fourth wire sections gradually increase.

14. The display module according to claim 6, wherein along a direction from which the display region points to the non-display region, extension lengths of second wire connections gradually decrease;

the second connection wire group comprises a b-th second connection wire of the plurality of second connection wires and a c-th second connection wire of the plurality of second connection wires, the plurality of data lines comprise a d-th data line and an e-th data line, and the d-th data line and the e-th data line are located on a same side of the first central axis, wherein b≠c and b and c are each a positive integer, and d≠e and d and e are each a positive integer;

the b-th second connection wire is electrically connected to the d-th data line, and the c-th second connection wire is electrically connected to the e-th data line; and the third wire section of the b-th second connection wire is located on a side of the third wire section of the c-th second connection wire facing away from the first central axis, and the d-th data line is located on a side of the e-th data line facing away from the first central axis.

15. The display panel according to claim 13, wherein the first connection wire group comprises a p-th first connection wire, and the second connection wire group comprises a q-th second connection wire;

the first wire section of the p-th first connection wire and the third wire section of the q-th second connection wire are symmetrical about the first central axis; and an extension length of the second wire section of the p-th first connection wire is the same as an extension length of the fourth wire section of the q-th second connection wire.

16. A display device, comprising a display panel, wherein the display panel comprises a display region and a non-display region, wherein the non-display region is located at least on a side of the display region;

wherein the display panel further comprises a plurality of data lines, a plurality of connection wires and a plurality of signal wires, wherein each of the plurality of connection wires is electrically connected to a respective one of the plurality of data lines and a respective one of the plurality of signal wires, the plurality of data lines and the plurality of connection wires are located in the display region, and the plurality of signal wires are located in the non-display region;

the plurality of connection wires comprise a first connection wire group and a second connection wire group, wherein the first connection wire group comprises a plurality of first connection wires, the second connection wire group comprises a plurality of second connection wires, the first connection wire group and the second connection wire group are located on two sides of a first central axis of the display panel respectively, and an extension direction of the first central axis is parallel to an extension direction of the plurality of data lines; and the first connection wire group and the second connection wire group are disposed asymmetrically, wherein a first connection wire of the plurality of first connection wires comprises a first wire section and a second wire section, wherein the first wire section and the second wire section are connected to each other, and an extension direction of the first wire section intersects an extension direction of the second wire section;

a second connection wire of the plurality of second connection wires comprises a third wire section and a fourth wire section, wherein the third wire section and the fourth wire section are connected to each other, and an extension direction of the third wire section intersects an extension direction of the fourth wire section;

the extension direction of the third wire section is parallel to the extension direction of the first wire section, and the extension direction of the fourth wire section is parallel to the extension direction of the second wire section;

the first connection wire group comprises V first connection wires, and the second connection wire group comprises W second connection wires, wherein the first wire section of a v-th first connection wire of the V first connection wires and the third wire section of a w-th second connection wire of the W second connection wires are symmetrical about the first central axis; and along the extension direction of the plurality of data lines, the second wire section of the v-th first connection wire and the fourth wire section of the w-th second connection wire are disposed in a staggered manner, wherein V, W, v and w are each a positive integer, $1 \leq v \leq V$, and $1 \leq w \leq W$, wherein the display panel comprises a plurality of subpixels located in the display region, wherein the plurality of subpixels are arranged in an array;

along a thickness direction of the display panel, the second wire section of the v-th first connection wire overlaps a D-th row of subpixels of the plurality of subpixels, and the fourth wire section of the w-th second connection wire overlaps an E-th row of subpixels of the plurality of subpixels, wherein $v=w$, and D is not equal to E.

* * * * *